(12) United States Patent
Kim

(10) Patent No.: US 8,344,450 B2
(45) Date of Patent: Jan. 1, 2013

(54) SEMICONDUCTOR DEVICE WITH BURIED BIT LINES AND METHOD FOR FABRICATING THE SAME

(75) Inventor: Su-Young Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/541,213

(22) Filed: Jul. 3, 2012

(65) Prior Publication Data

US 2012/0267723 A1 Oct. 25, 2012

Related U.S. Application Data

(62) Division of application No. 12/841,742, filed on Jul. 22, 2010, now Pat. No. 8,236,652.

(30) Foreign Application Priority Data

Nov. 30, 2009 (KR) .................. 10-2009-0117433
May 31, 2010 (KR) .................. 10-2010-0051196

(51) Int. Cl.
 *H01L 29/94* (2006.01)
(52) U.S. Cl. ..... 257/328; 257/330; 257/341; 257/E27.06
(58) Field of Classification Search .......... 257/328–332, 257/334, 341
See application file for complete search history.

(56) References Cited

U.S. PATENT DOCUMENTS

2011/0003447 A1* 1/2011 Kim et al. ............... 438/270
2011/0127605 A1* 6/2011 Kim ........................ 257/334

* cited by examiner

*Primary Examiner* — Jack Chen
(74) *Attorney, Agent, or Firm* — IP & T Group LLP

(57) ABSTRACT

A semiconductor device includes: a semiconductor substrate configured to include a plurality of trenches therein; a plurality of buried bit lines each configured to fill a portion of each trench; a plurality of active pillars each formed in an upper portion of each buried bit line; a plurality of vertical gates each configured to surround each active pillar; and a plurality of word lines configured to couple neighboring vertical gates with each other.

7 Claims, 24 Drawing Sheets

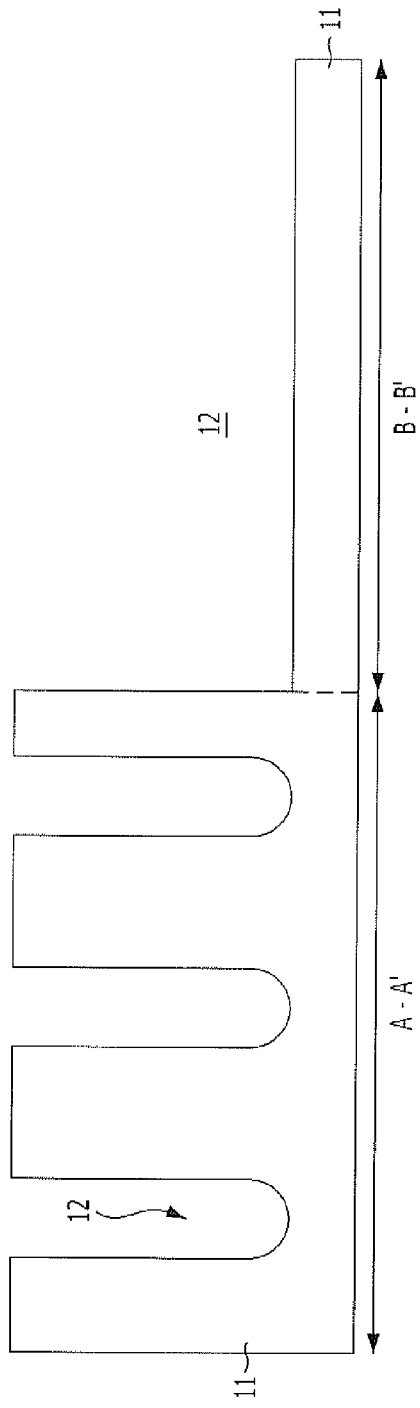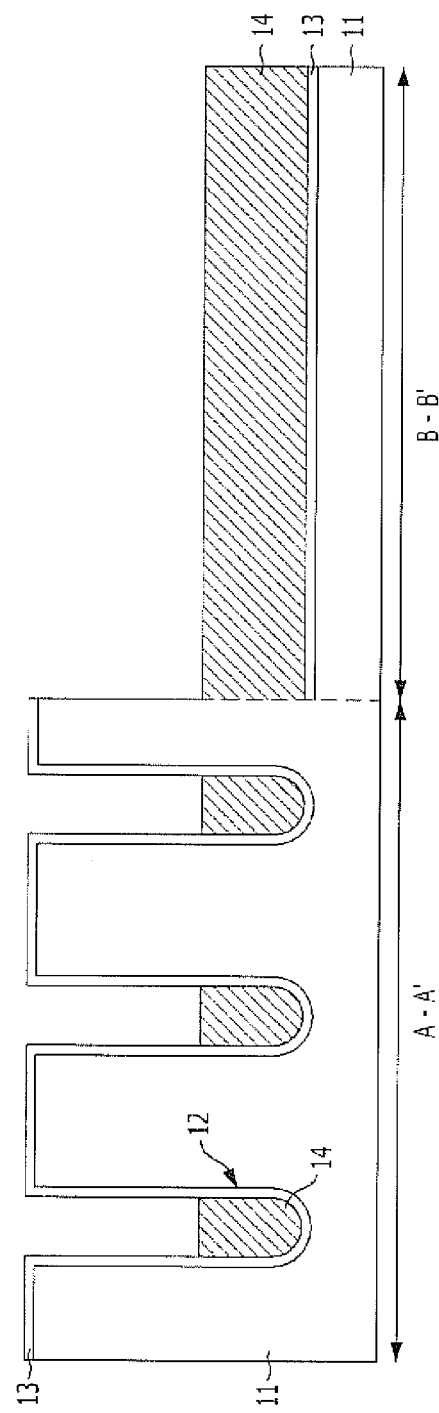

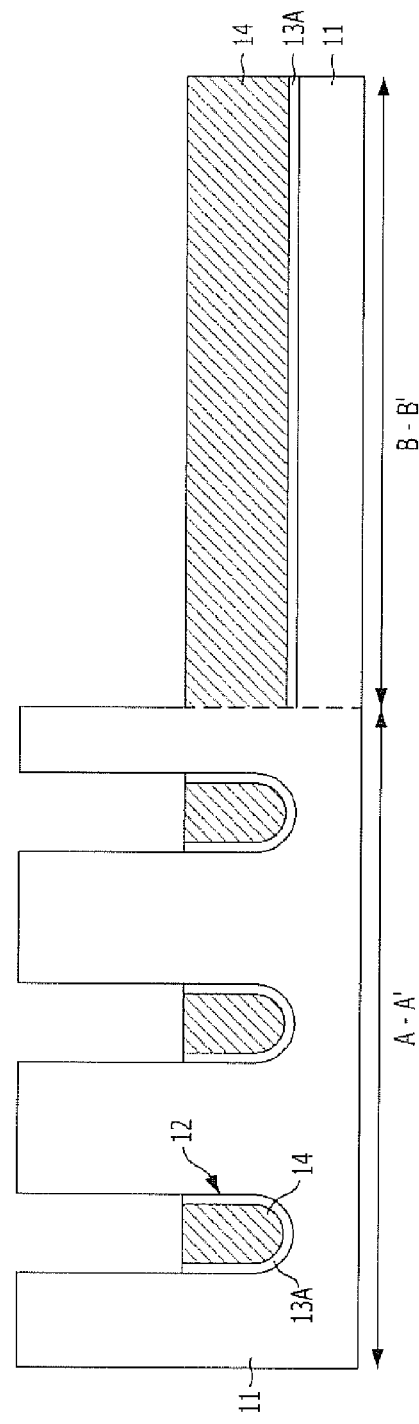
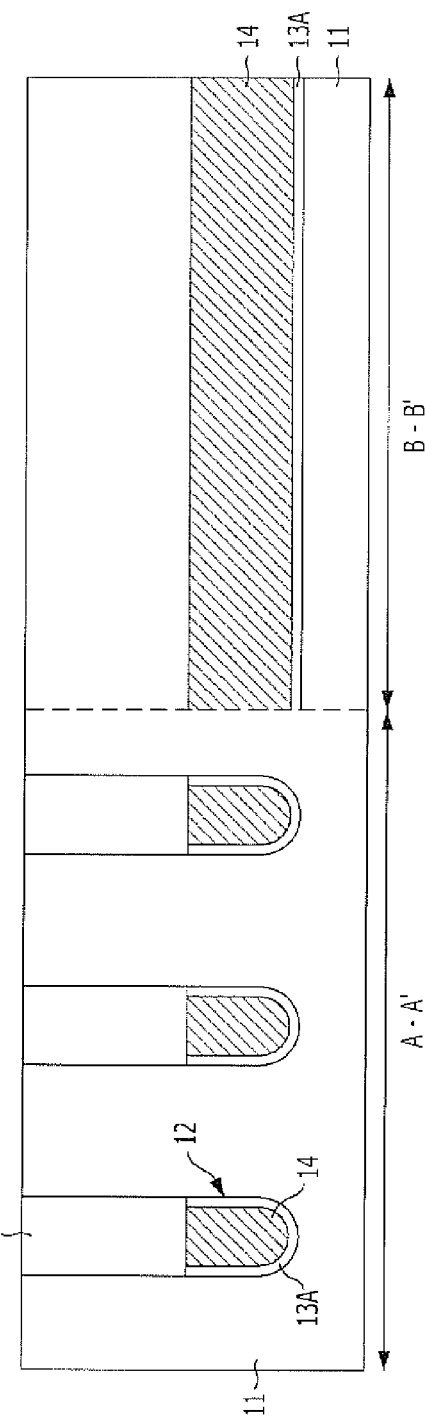

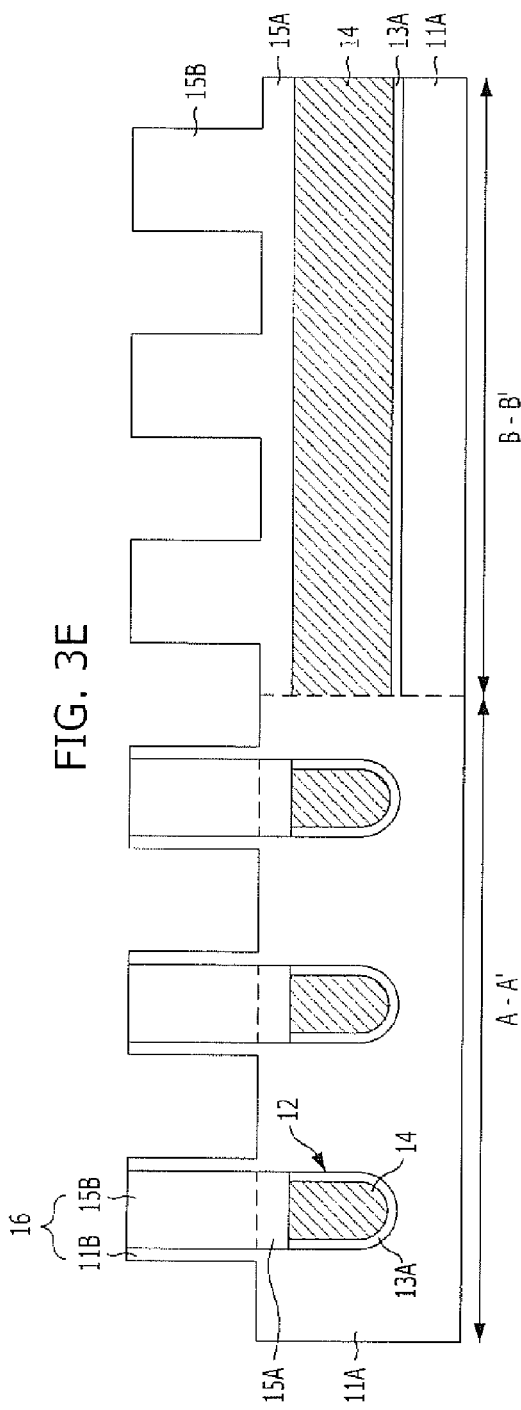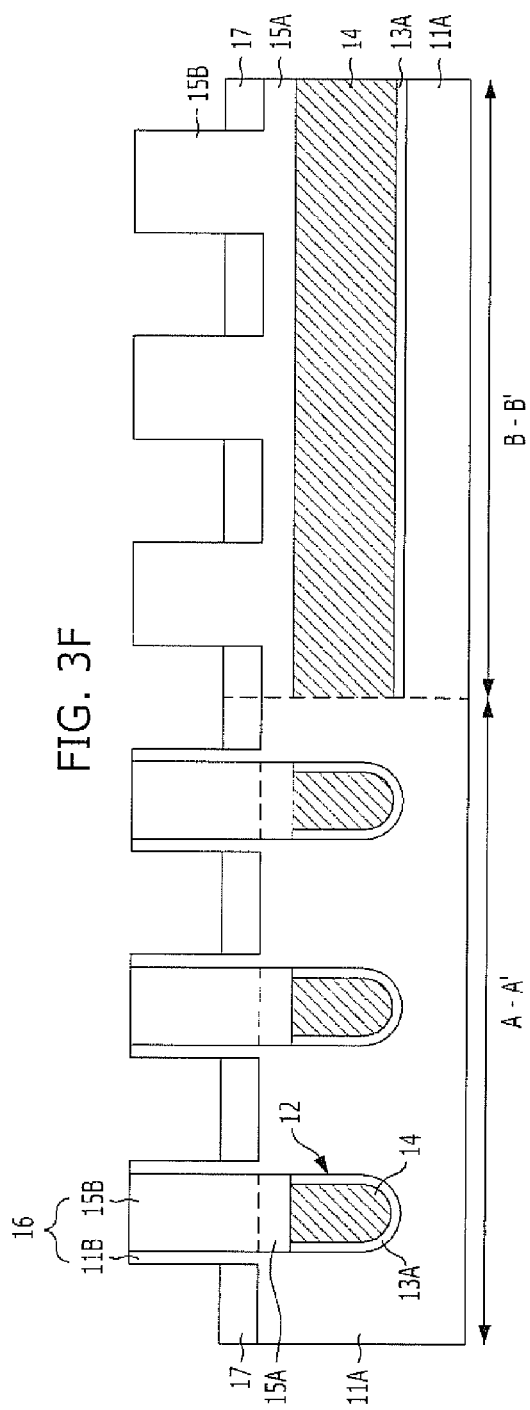

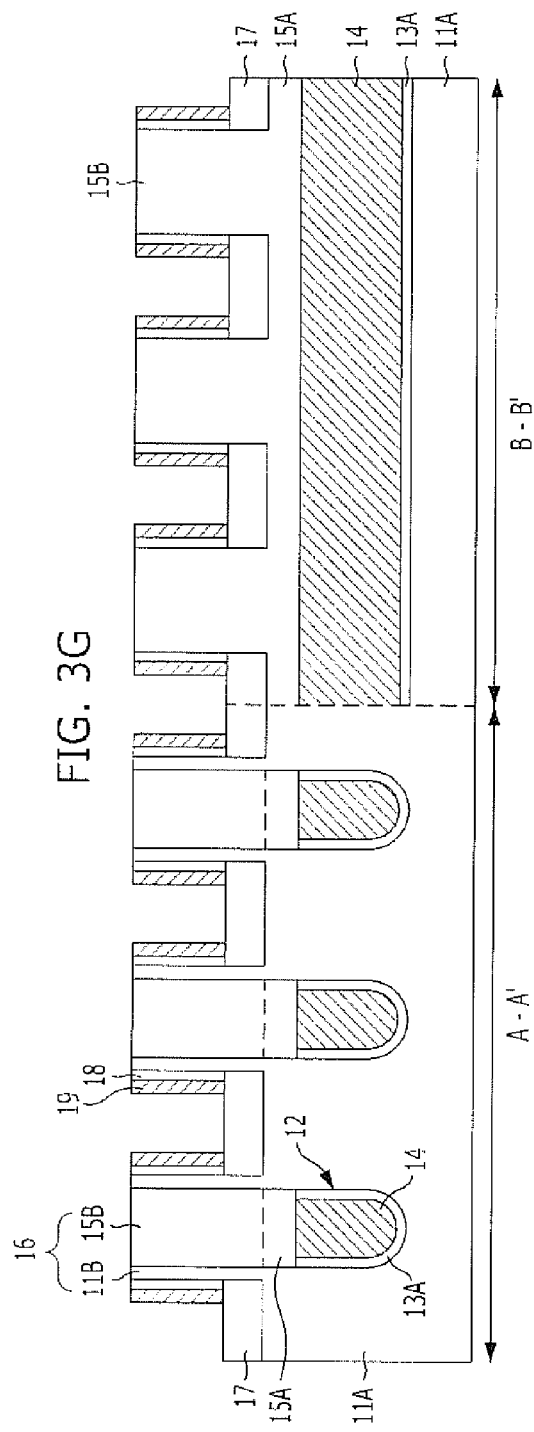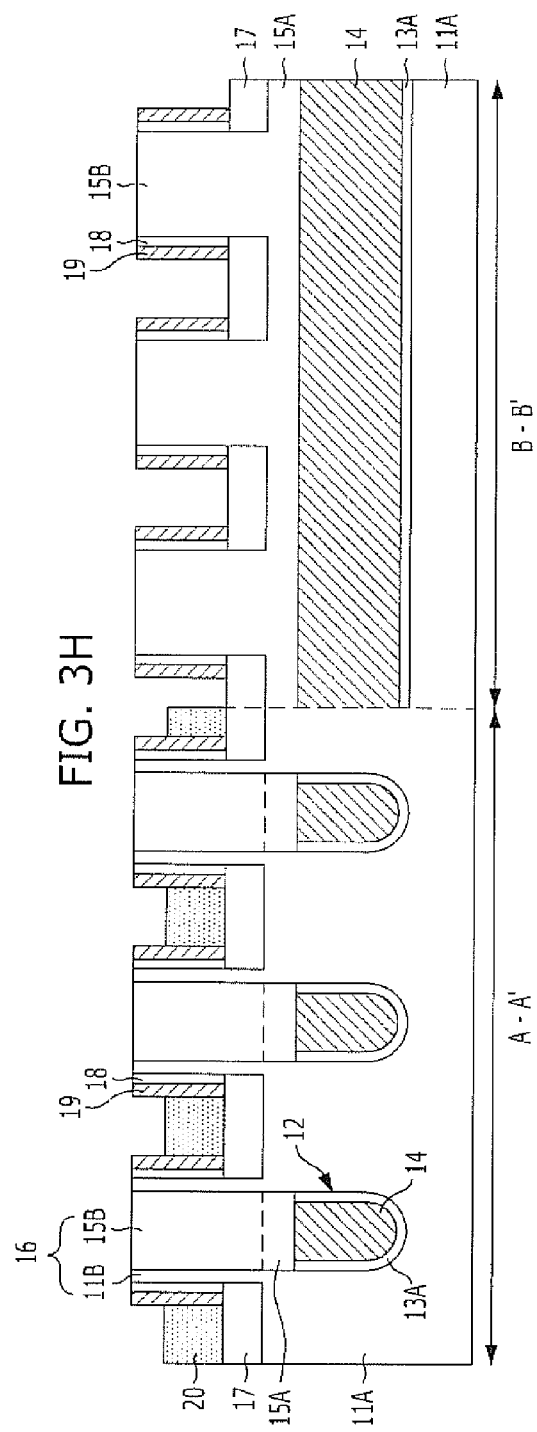

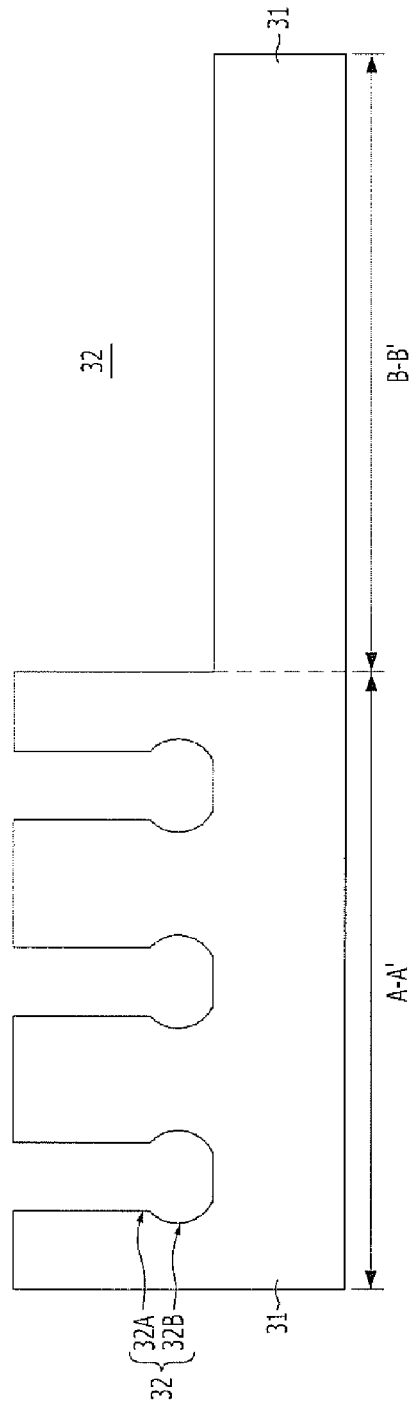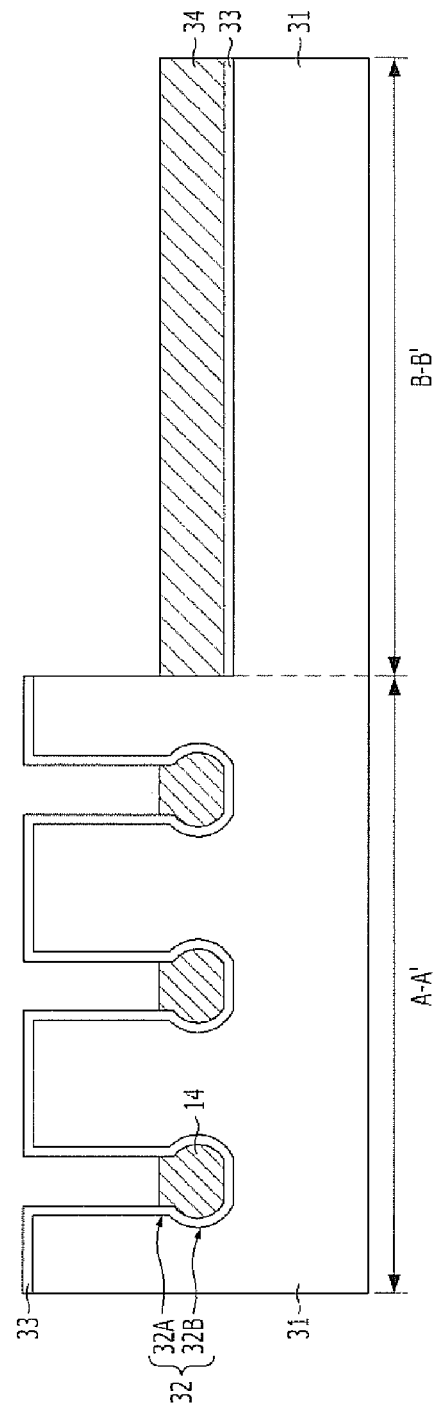

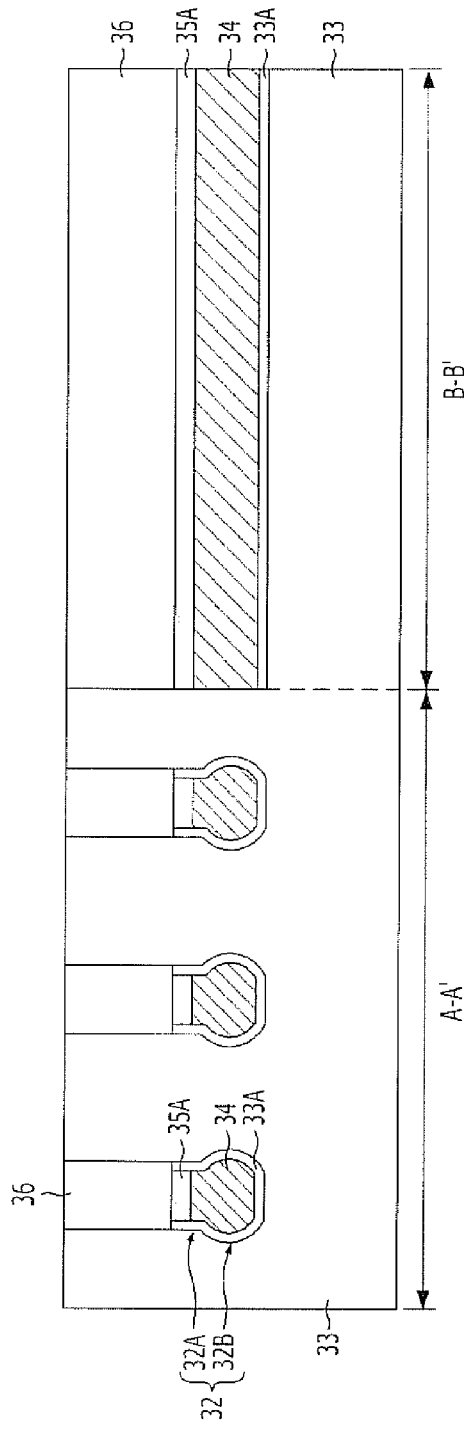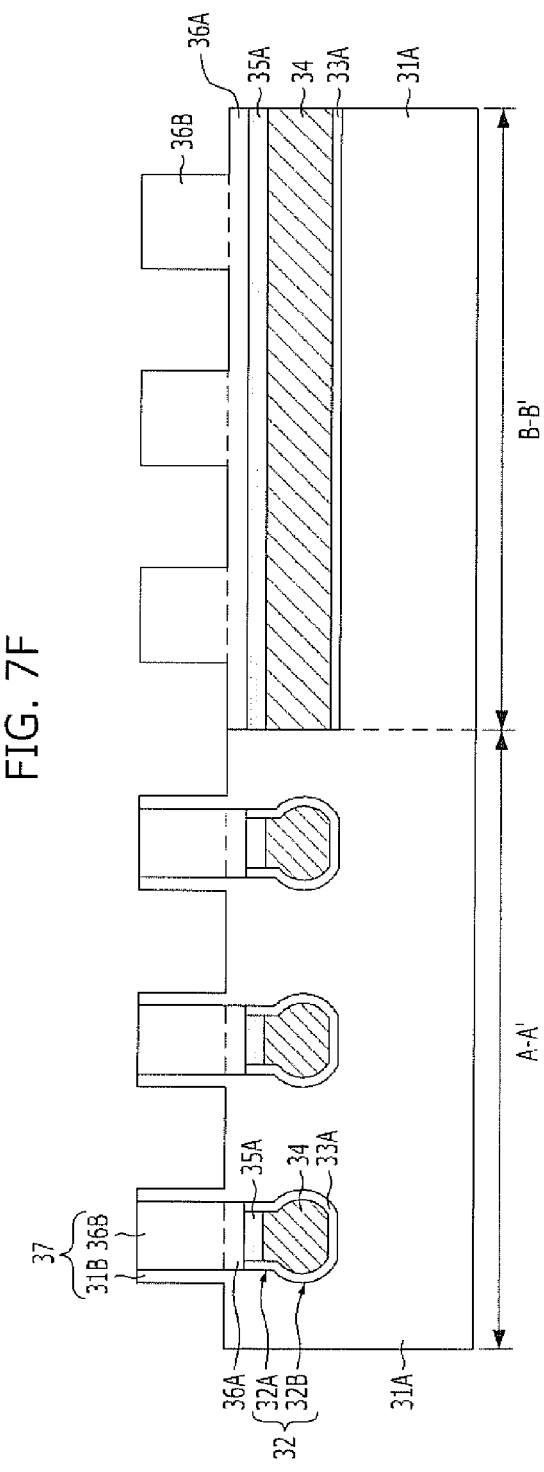

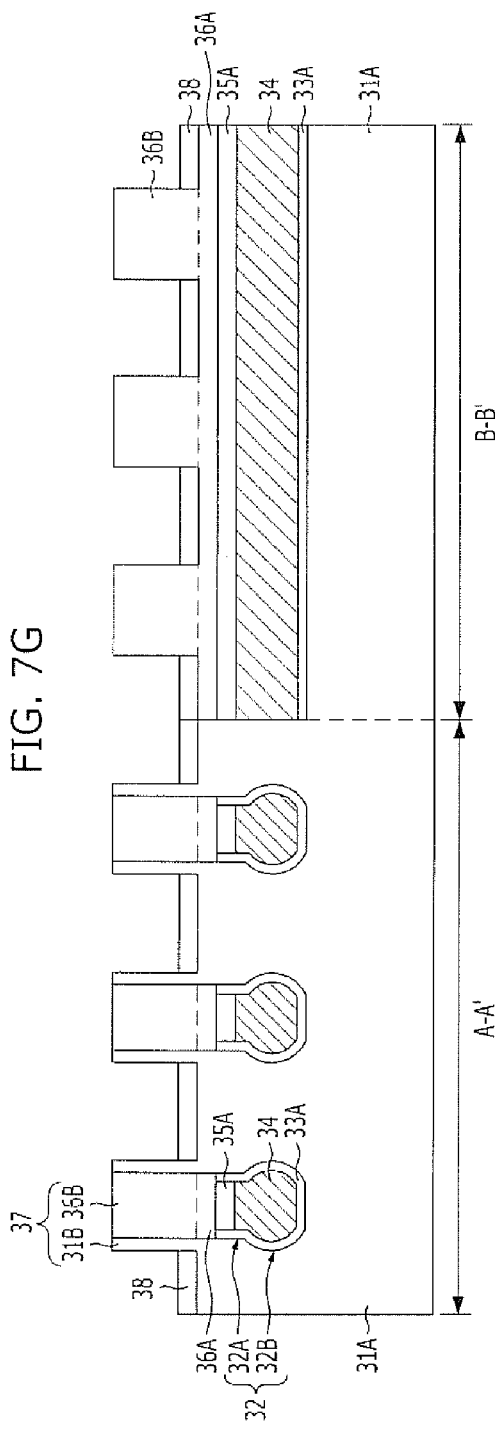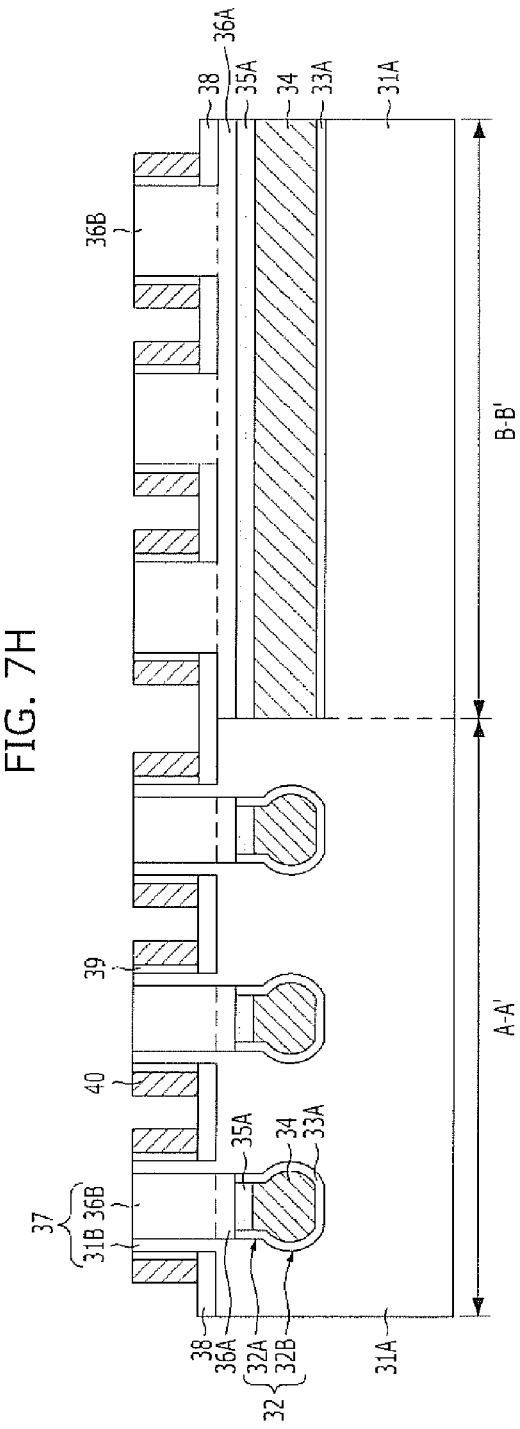

SEMICONDUCTOR DEVICE WITH BURIED BIT LINES AND METHOD FOR FABRICATING THE SAME

CROSS-REFERENCES TO RELATED APPLICATIONS

This application is a division of U.S. patent application Ser. No. 12/841,742 filed on Jul. 22, 2010, which claims priority of Korean Patent Application Nos. 10-2009-0117433 and 10-2010-0051196, filed on Nov. 30, 2009, and May 31, 2010, respectively. The disclosure of each of the foregoing applications is incorporated herein by reference in its entirety.

BACKGROUND OF THE INVENTION

Exemplary embodiments of the present invention relate to a method for fabricating a semiconductor device, and more particularly, to a semiconductor device including buried bit lines, and a method for fabricating the semiconductor device.

To increase the integration degree, memory devices manufactured by under 40 nm process are useful. In case of planar transistors or recessed gate transistors used in cell architectures of $8F^2$ or $6F^2$, where F denotes a minimum feature size, it is difficult to perform scaling under 40 nm. Therefore, a cell having a cell architecture of $4F^2$ that may improve the integration degree by 1.5 to 2 times with the same scaling is useful. Accordingly, a vertical gate forming process is introduced.

Vertical gate forming process is a process for forming a surround-type gate electrode, which is referred to as a vertical gate, hereafter, surrounding an active pillar extended vertically from a semiconductor substrate and forming a source region and a drain region in the upper and lower portions of the active pillar with respect to the vertical gate, respectively. With the vertical gate forming process, channels are formed vertically and accordingly, although the area of a transistor on the semiconductor substrate is reduced, the length of channels is not restricted by the reduced area.

Through the vertical gate forming process, memory cells come to have buried bit lines for high integration, which are formed by performing ion implantation using a dopant.

However, in shrinking a semiconductor device, reducing the resistance of the buried bit lines by performing the dopant ion implantation is difficult. Thus, the characteristics of the semiconductor device may deteriorate.

To alleviate such a concern, a metal silicidation method is suggested for forming buried bit lines.

The conventional technology, however, has the following drawbacks.

According to the metal silicidation method, a silicided portion is cut according to the size of each cell after the metal silicidation in order to separate neighboring bit lines from each other. When the silicided portion is cut, the cross-sectional area of a contact is reduced and the reduced cross-sectional area increases a resistance value. Also, since the metal silicidation is performed from the surface of the space between active pillars, the distance from the vertical gate becomes short and thus bridging may occur.

According to conventional methods, active pillars are formed first and then bit lines are formed later. The formation of bit lines after the formation of the active pillars may negatively affect resistance.

Therefore, it is required to develop a method that can resolve the problems of complicated fabrication process and resistance increasing due, to the reduced cross-sectional area when the bit lines are formed, while using the vertical gate forming process.

SUMMARY OF THE INVENTION

An embodiment of the present invention is directed to a semiconductor device that may decrease the resistance of buried bit lines and simplify a fabrication process, and a method for fabricating the semiconductor device.

In accordance with an embodiment of the present invention, a semiconductor device includes: a semiconductor substrate configured to include a plurality of trenches therein; a plurality of buried bit lines each configured to fill a portion of each trench; a plurality of active pillars each formed in an upper portion of each buried bit line; a plurality of vertical gates each configured to surround each active pillar; and a plurality of word lines configured to couple neighboring vertical gates with each other.

In accordance with another embodiment of the present invention, a method for fabricating a semiconductor device, which includes: forming a plurality of trenches by etching a semiconductor substrate; forming a plurality of buried bit lines each filling a portion of each trench; forming a conductive layer gap-filling upper portions of the plurality of the buried bit lines; forming a plurality of active pillars by simultaneously etching the conductive layer and the semiconductor substrate; forming a plurality of vertical gates each surrounding each active pillar; and forming a plurality of word lines coupling neighboring vertical gates with each other.

BRIEF DESCRIPTION OF THE DRAWINGS

FIGS. 3A to 3H are cross-sectional views describing a method for fabricating the semiconductor device of FIG. 1 along the line A-A' and the line B-B' in accordance with the first embodiment of the present invention.

FIGS. 7A to 7I are cross-sectional views describing a method for fabricating the semiconductor device of FIG. 5 along the line A-A' and the line B-B' in accordance with the second embodiment of the present invention.

DESCRIPTION OF SPECIFIC EMBODIMENTS

Figure 1:
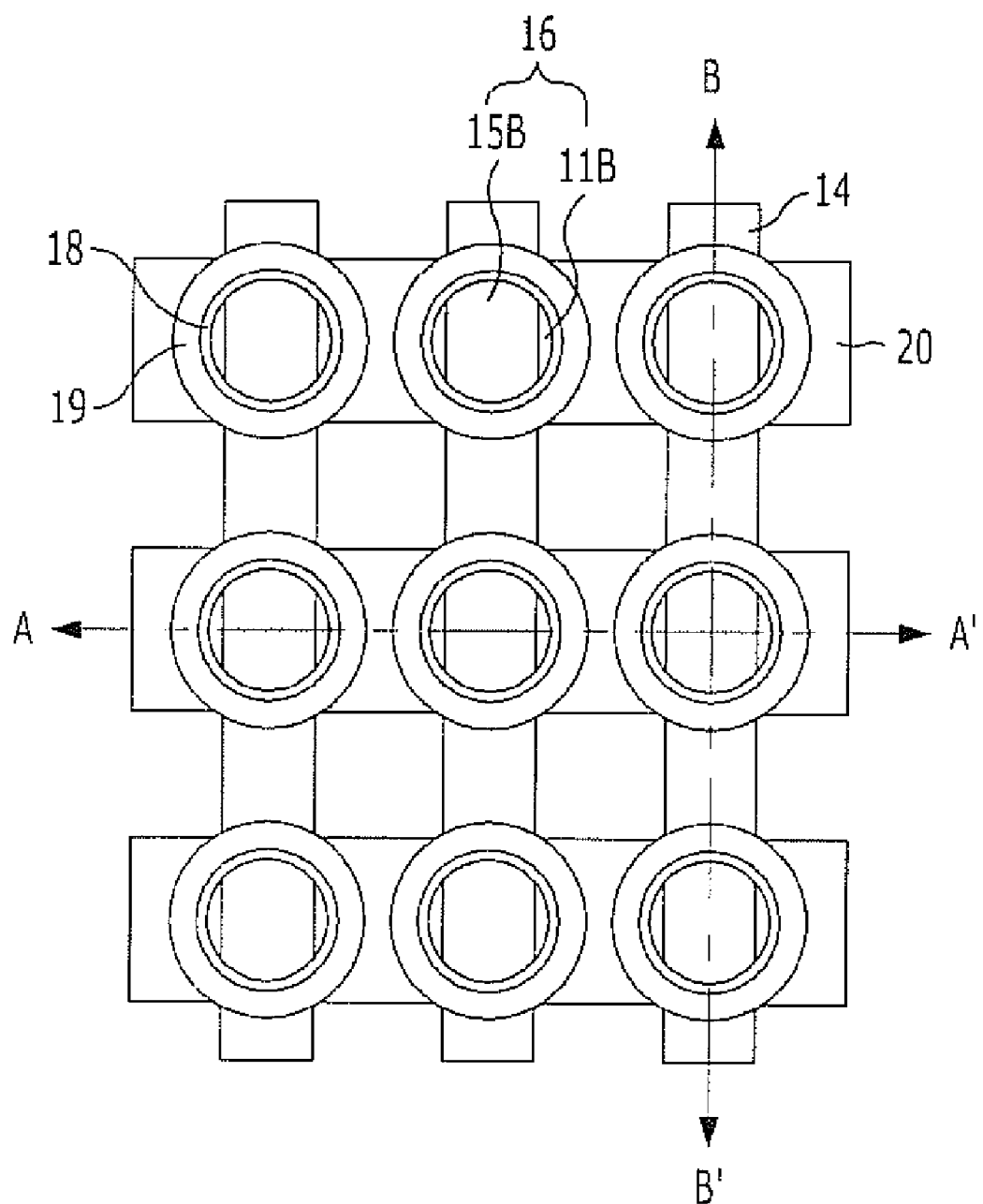
FIG. 1 is a plan view illustrating a semiconductor device in accordance with a first embodiment of the present invention.

Exemplary embodiments of the present invention will be described below in more detail with reference to the accompanying drawings. The present invention may, however, be embodied in n different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

An exemplary embodiment is directed to a semiconductor device that may reduce the resistance of buried bit lines as well as simplifying process for manufacturing a vertical gate semiconductor device, and a method for fabricating the semiconductor device. Here, buried bit lines are formed as a metal layer under active pillars before the formation of the active pillars.

1st Embodiment

Figure 2A:
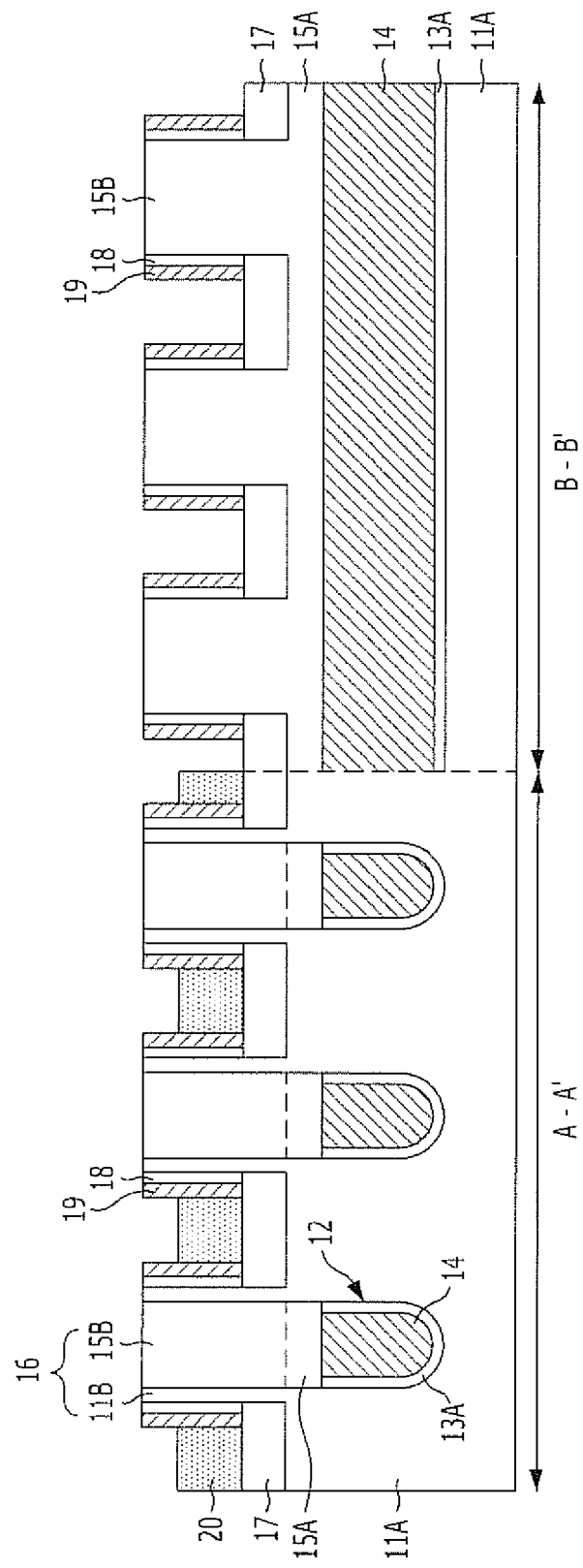
FIG. 2A is a cross-sectional view of the semiconductor device of FIG. 1 along a line A-A' and a line B-B'.
Figure 2B:
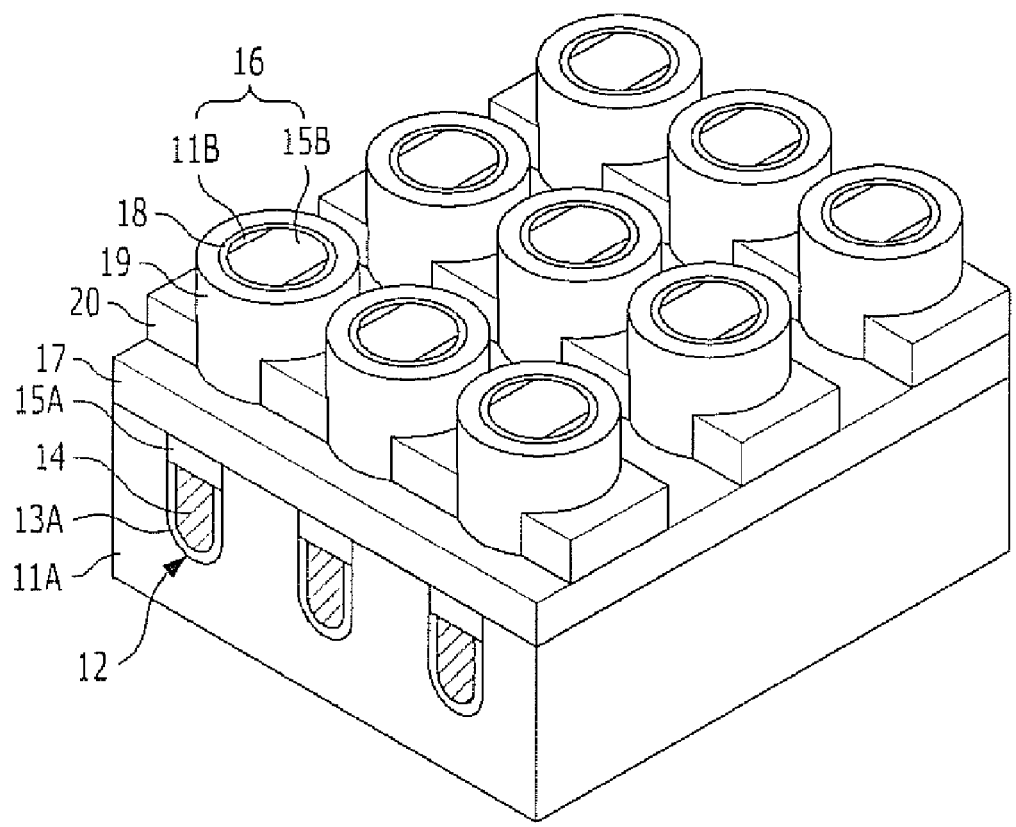
FIG. 2B is a perspective view of the semiconductor device shown in FIG. 1.

FIG. 1 is a plan view illustrating a semiconductor device in accordance with a first embodiment of the present invention. FIG. 2A is a cross-sectional view of the semiconductor device of FIG. 1 along a line A-A' and a line B-B'. FIG. 2B is a perspective view of the semiconductor device shown in FIG. 1.

Referring to FIGS. 1, 2A and 2B, a semiconductor substrate 11A includes a plurality of trenches 12, and a plurality of buried bit lines 14 are formed to fill a portion of each trench 12, individually. The buried bit lines 14 may be a metal layer, which has a lower resistance than the resistance of the buried bit lines 14 formed through an ion implantation process. A barrier layer pattern 13A may be disposed on the interface between the buried bit lines 14 and the semiconductor substrate 11A to prevent diffusion. The barrier layer pattern 13A may be a stacked layer where a titanium (Ti) layer and a titanium nitride (TiN) layer are stacked.

A plurality of active pillars 16 are formed over the buried bit lines 14. Each active pillar 16 includes a first active pillar 15B gap-filling the upper portion of a buried bit line 14 and a second active pillar 11B formed on both sidewalls of the first active pillar 15B. The second active pillar 11B is a structural element formed by etching the semiconductor substrate 11A, and the first active pillar 1513 is a silicon epitaxial layer. These elements will be described in detail later. An inter-layer dielectric layer 17 is formed over the semiconductor substrate 11A around the active pillar 16. A conductive layer pattern 15A is disposed between the buried bit line 14 and the first active pillar 15B, and the conductive layer pattern 15A is of the same material as that of the first active pillar 15B. The conductive layer pattern 15A electrically connects the active pillar 16 to the buried bit line 14.

The active pillars 16 are disposed over the buried bit lines 14, respectively. In other words, each of the active pillars 16, which are disposed apart from each other by a desired space, is formed in the upper portion of each buried bit line 14. As a result, the active pillars 16 are arranged in a matrix form.

The external walk of each active pillar 16 are surrounded by a each vertical gate 19, and a gate insulation layer 18 is formed between the vertical gate 19 and the active pillar 16.

Neighboring vertical gates 19 are connected to each other by word lines 20. The word lines 20 are insulated from the buried bit lines 14 by the inter-layer dielectric layer 17. The word lines 20 and the buried bit lines 14 are arranged to cross each other at, for example, right angles. The word lines 20 may be a metal layer. For example, the word lines 20 include any one selected from the group consisting of tungsten silicide ($WSi_x$), titanium nitride (TiN), tungsten (W), aluminum (Al), copper (Cu), gold (Au), and ruthenium (Ru).

FIGS. 3A to 3H are cross-sectional views describing a method for fabricating the semiconductor device of FIG. 1 along the line A-A' and the line B-B' in accordance with the first embodiment of the present invention. FIGS. 4A to 4H are perspective views describing the method for fabricating the semiconductor device in accordance with the first embodiment of the present invention.

Figure 4A:
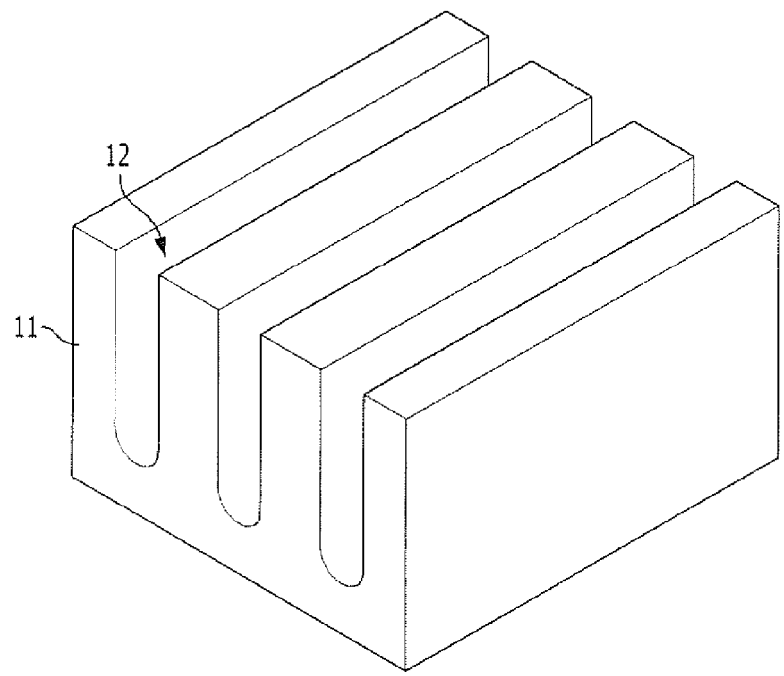
FIGS. 4A to 4H are perspective views describing the method for fabricating the semiconductor device in accordance with the first embodiment of the present invention.

Referring to FIGS. 3A and 4A, the trenches 12 are formed by etching a semiconductor substrate 11 to a desired depth. The semiconductor substrate 11 may include a silicon substrate. To form the trenches 12, the semiconductor substrate 11 may be etched using a hard mask layer (not shown). The trenches 12 are formed as a line type. The etching method for etching the semiconductor substrate 11 to form the trenches 12 may be an anisotropic dry etch process. When the semiconductor substrate 11 is a silicon substrate, chlorine ($Cl_2$) gas or hydrogen bromide (HBr) gas may be used alone or a mixed gas of chlorine ($Cl_2$) gas and hydrogen bromide (HBr) gas may be used. The depth of the trenches 12 depends on the height of the buried bit lines 14, which will be formed subsequently. For example, the trenches 12 may be formed with a depth of at least approximately 5,000 Å.

Figure 4B:
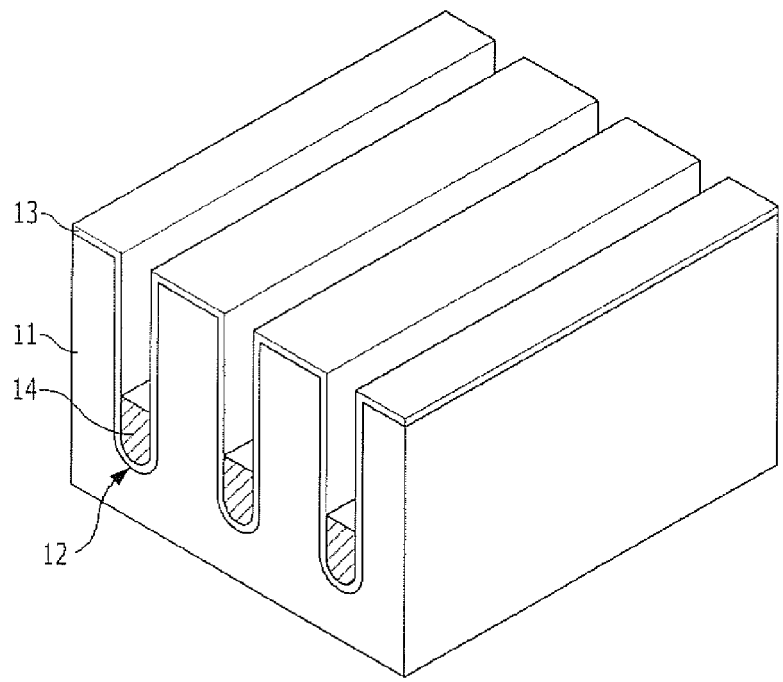

Referring to FIGS. 3B and 4B, a barrier layer 13 is formed on the surface of the semiconductor substrate 11 including the trenches 12. The barrier layer 13 may be formed by stacking a titanium (Ti) layer and a titanium nitride (TiN) layer. According to another embodiment, a spacer insulation layer instead of forming the barrier layer 13 may be formed using a nitride layer.

Subsequently, a metal layer is formed over the barrier layer 13 until the trenches 12 are gap-filled, and the buried bit lines 14 each filling a portion of each trench 12 are formed by performing an etch-back process. Here, the metal layer used as the buried bit lines 14 may include a tungsten layer.

Figure 4C:
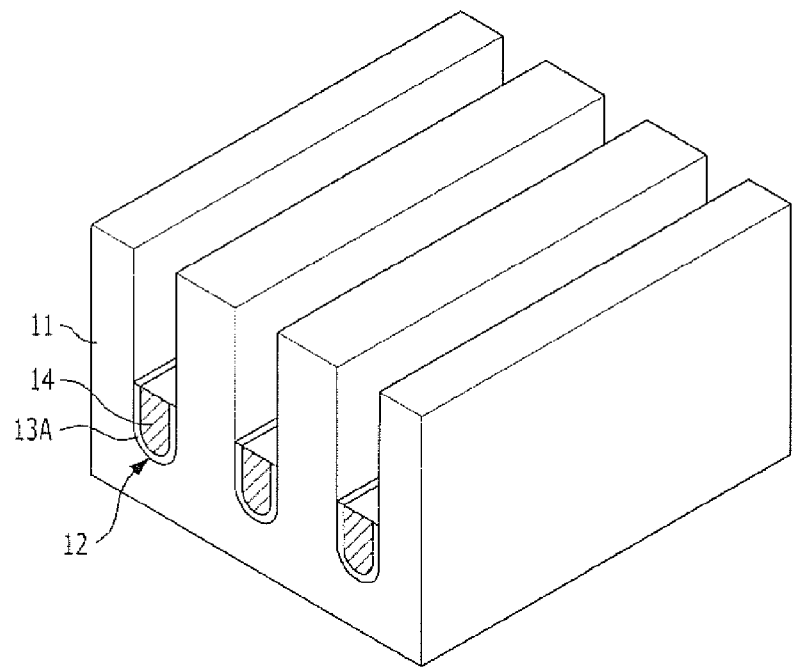

Referring to FIGS. 3C and 4C, the sidewalls of each trench 12 (that is, the barrier layer 13 over the semiconductor substrate 11) are selectively removed, except the buried bit lines 14. Hereafter, the etched barrier layer 13 is referred to as a barrier layer pattern 13A.

The barrier layer 13 is etched through the etch-back process. Accordingly, the barrier layer pattern 13A remains only on the interface between the buried bit lines 14 and the semiconductor substrate 11 in the inside of the trenches 12. Hereafter, the sidewalls of the trench 12 after the barrier layer 13 is removed are referred to as top sidewalls for illustration purposes.

Figure 4D:
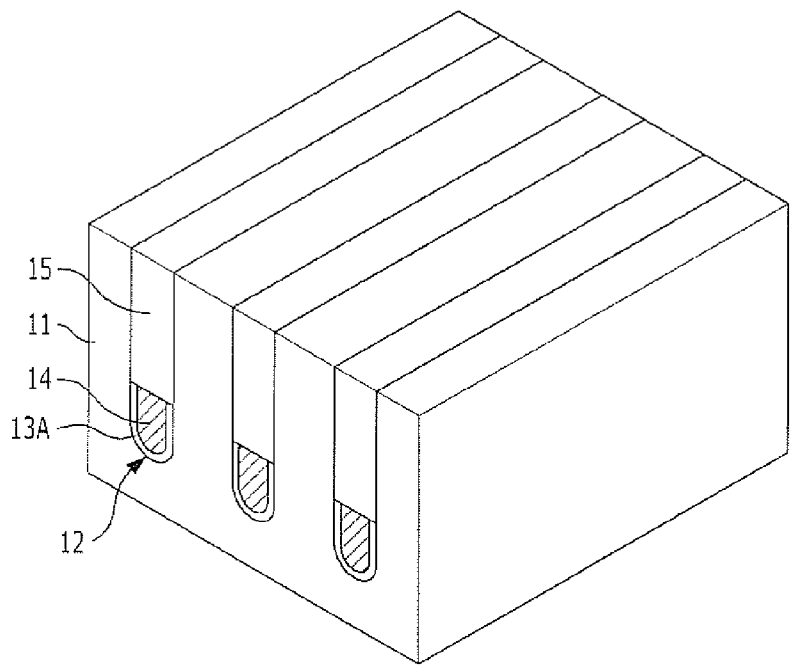

Referring to FIGS. 3D and 4D, a conductive layer 15 gap-filling the upper portion of each buried bit line 14 is formed. The conductive layer 15 gap-fills the upper-portion of each buried bit line 14 through epitaxial growth. Here, the epitaxial growth is performed on the top sidewalls. Since the semiconductor substrate 11 is a silicon substrate, it is called silicon epitaxial growth.

Through the epitaxial growth, the conductive layer 15 gap-filling the upper portion of the buried bit line 14 is grown, and the conductive layer 15 includes a silicon epitaxial layer.

Meanwhile, the conductive layer 15 may also grow on the upper surface of the semiconductor substrate 11, and a surface step height may occur due to the conductive layer 15 formed on the upper surface of the semiconductor substrate 11. Therefore, a planarization process may be performed to remove the surface step height on the upper surface of the semiconductor substrate 11. Here, the planarization process may be a Chemical Mechanical Polishing (CMP) process.

Figure 4E:
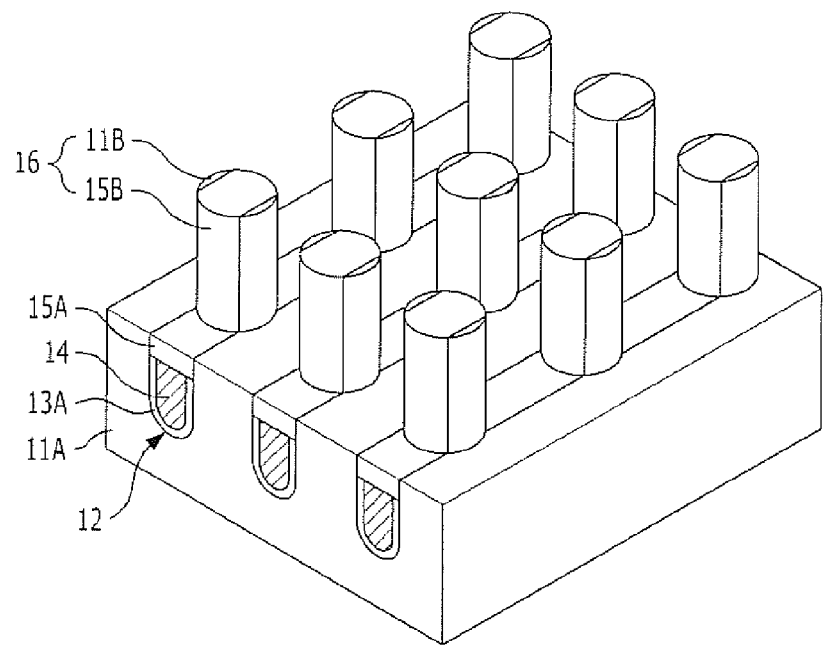

Referring to FIGS. 3E and 4E, the active pillars 16 separated from each other are formed by simultaneously etching the semiconductor substrate 11 and the conductive layer 15. Here, the active pillars 16 may have a cylindrical pillar structure. The active pillars 16 may be referred to as active regions as well. Hereafter, the semiconductor substrate 11 with the active pillars 16 is denoted with 11A.

The active pillars 16 have a structure of cylindrical pillars, each of which includes the first active pillar 15B and the second active pillar 11B. The first active pillar 15B is formed by steps including etching the conductive layer 15, and the second active pillar 11B is formed by etching the semiconductor substrate 11. Here, the first active pillar 15B is a silicon epitaxial layer, and the second active pillar 11B is a silicon layer. The first active pillar 15B according to an example may be the same epitaxial layer that forms the conductive layer pattern 15A and is etched to form the first active pillar 15B at the same time that the second active pillar 11B is formed by etching the semiconductor substrate 11. The active pillars 16 may be called silicon structures. Looking at the active pillars 16 from the top, the active pillars 16 are arranged in the form of matrix.

The active pillars 16 are formed by etching the semiconductor substrate 11 by using a photoresist pattern (not shown), and the etch depth is decided in such a manner that the bottom surface of the etched portion is at least higher than the upper surface of the buried bit lines 14. Accordingly, the conductive layer pattern 15A may remain with a desired thickness in the upper portion of the buried bit lines 14, and the height of the semiconductor substrate 11A may be lowered by lowering the second active pillar 11B. The conductive layer pattern 15A has a pattern of integrated lines connected to the first active pillars 15B in the upper portion of the conductive layer pattern 15A. The active pillars 16 functioning as active regions with the conductive layer pattern 15A are electrically connected to the buried bit lines 14.

Figure 4F:
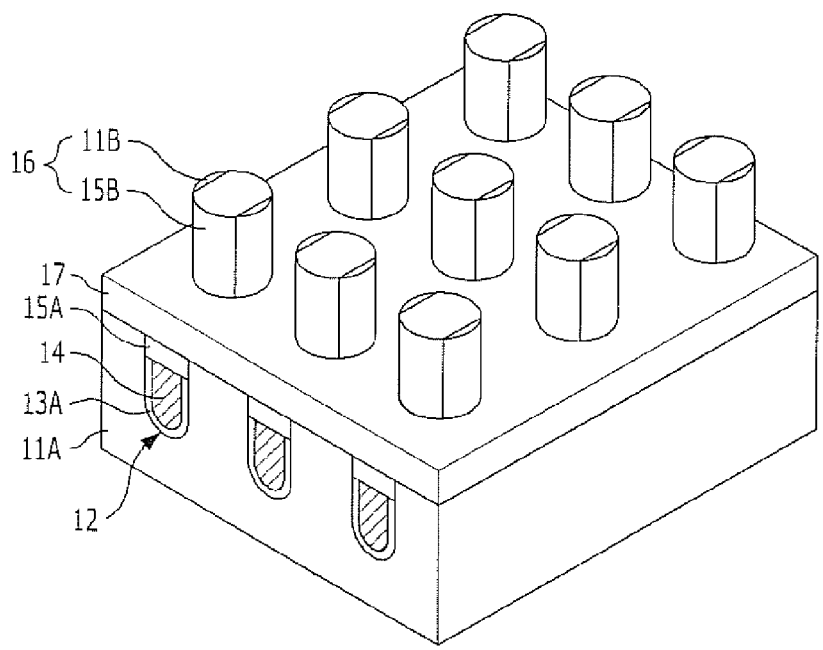

Referring to FIGS. 3F and 4F, the inter-layer dielectric layer 17 gap-filling the space between the active pillars 16 is formed, and then a recess process is performed by sequentially performing an etch-back process and a wet etch process. The inter-layer dielectric layer 17 may be formed of barn-phosphorous silicate glass (BPSG), which has excellent gap-filling characteristics. The inter-layer dielectric layer 17 covers the surfaces of the semiconductor substrate 11A around the active pillars 16 and the conductive layer pattern 15A.

Figure 4G:
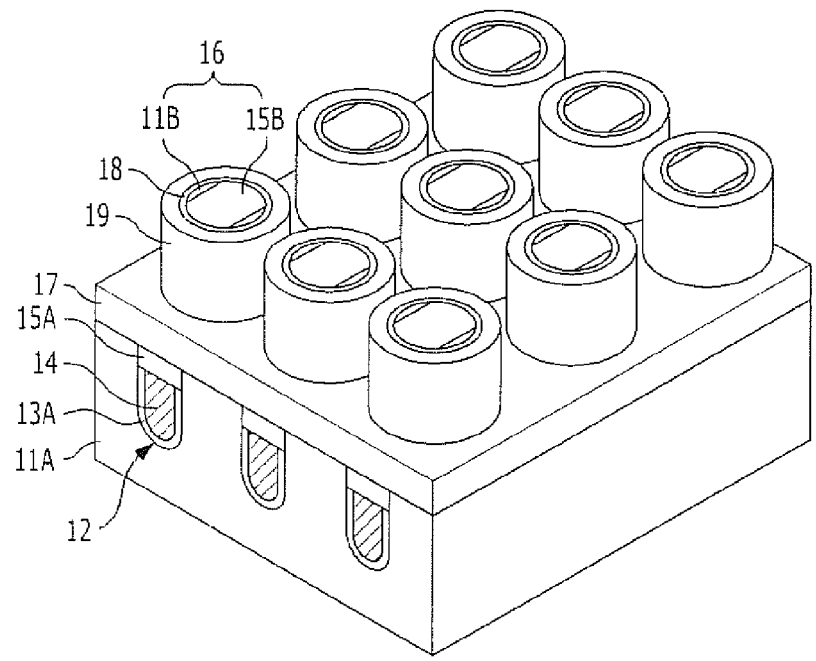

Referring to FIGS. 3G and 4G, a gate insulation layer 18 is formed on the sidewalls of the active pillars 16. The gate insulation layer 18 may include a silicon oxide layer, and the gate insulation layer 18 may be formed with a thickness of approximately 50 Å through a deposition process or an oxidation process.

Subsequently, vertical gates 19 are formed by depositing the conductive layer to be used as gates and performing an etch-back process. The conductive layer used as the vertical gate 19 may be a metal layer or a polysilicon layer. The vertical gates 19 are of a surround gate type, where each vertical gate 19 surrounds the respective active pillar 16.

Figure 4H:
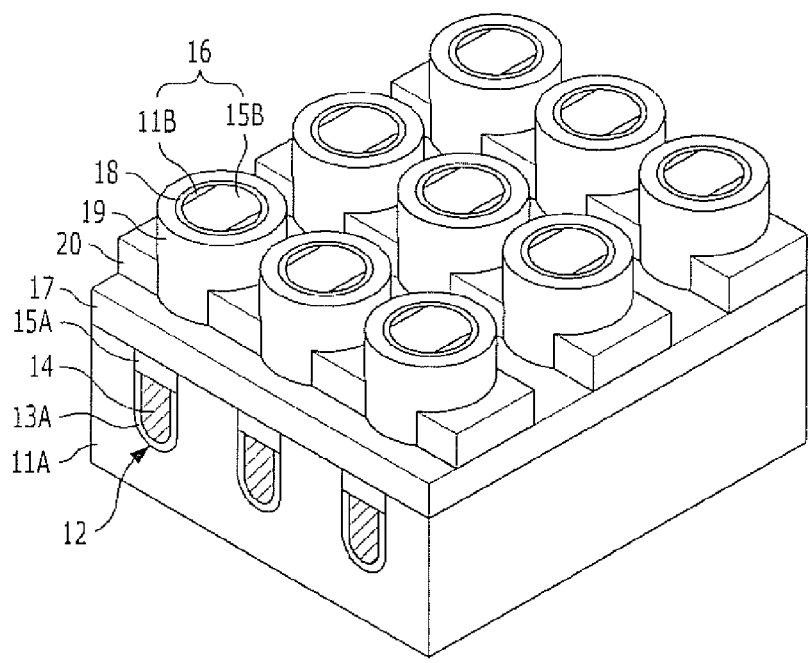

Referring to FIGS. 3H and 4H, the word lines 20 are formed to connect the neighboring vertical gates 19 to each other. The word lines 20 may be a metal layer. For example, the word lines 20 may include any one selected from the group consisting of tungsten silicide ($WSi_x$), titanium nitride (TiN), tungsten (W), aluminum (Al), copper (Cu), gold (Au), and ruthenium (Ru). The word lines 20 are arranged to cross the buried bit lines 14 at, for example, right angles, and the word lines 20 are insulated from the buried bit lines 14 by the inter-layer dielectric layer 17.

The word lines 20 may be formed as follows.

First, a metal layer to be used as the word lines 20 is formed over the substrate structure including the vertical gates 19, and a partial etch-back process is performed onto the metal layer. Subsequently, the word lines 20 are formed by partially etching the metal layer in a direction crossing the buried bit lines 14.

According to the first embodiment of the present invention, the resistance of the buried bit lines 14 may be decreased by forming the buried bit lines 14 of a metal layer.

Also, with the buried bit lines 14 partially fill the trenches 12 under the active pillars 16, the dimensions of the buried bit lines 14 may be increased easily. Therefore, the resistance of the buried bit lines 14 may further be reduced.

In addition, since the active pillars 16, the vertical gate 19, and the word lines 20 are formed after the formation of the buried bit lines 14, the process for forming the buried bit lines 14 may be simplified, which leads to decreased complexity in a semiconductor device fabrication process.

Furthermore, according to the first embodiment of the present invention, an etch process for separating the buried bit lines 14 between neighboring cells may be avoided. Therefore, the process for forming the buried bit lines 14 may further be simplified.

2nd Embodiment

Figure 5:
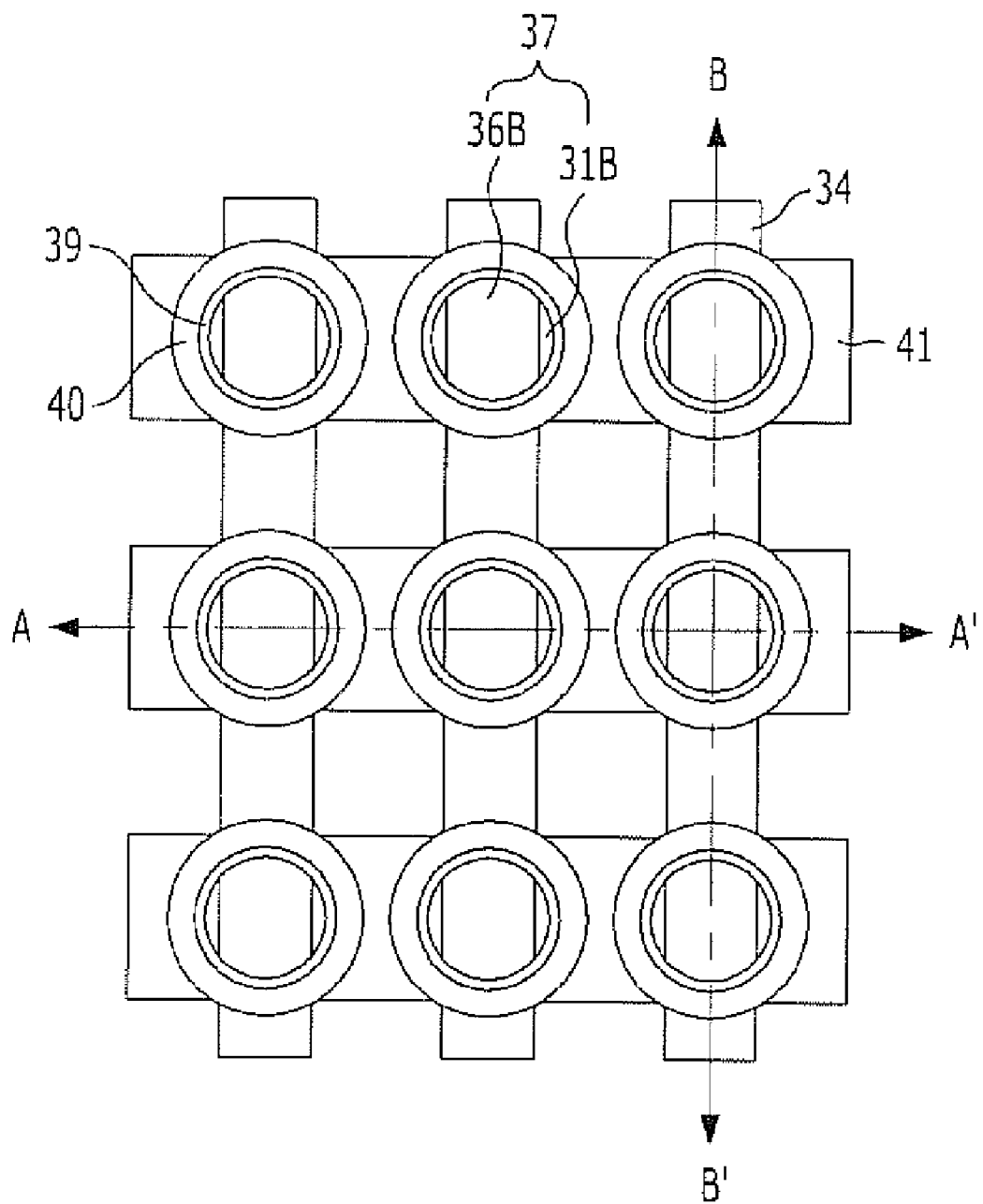
FIG. 5 is a plan view illustrating a semiconductor device in accordance with a second embodiment of the present invention.
Figure 6A:
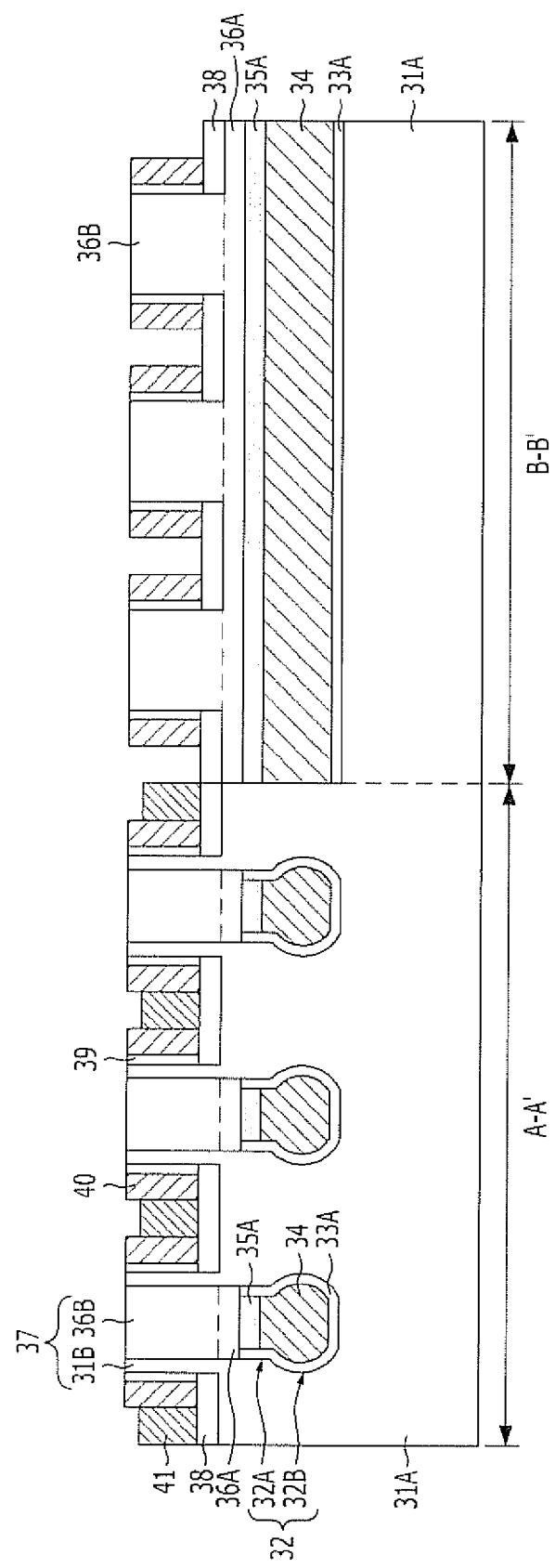
FIG. 6A is a cross-sectional view of the semiconductor device of FIG. 5 along a line A-A' and a line B-B'.
Figure 6B:
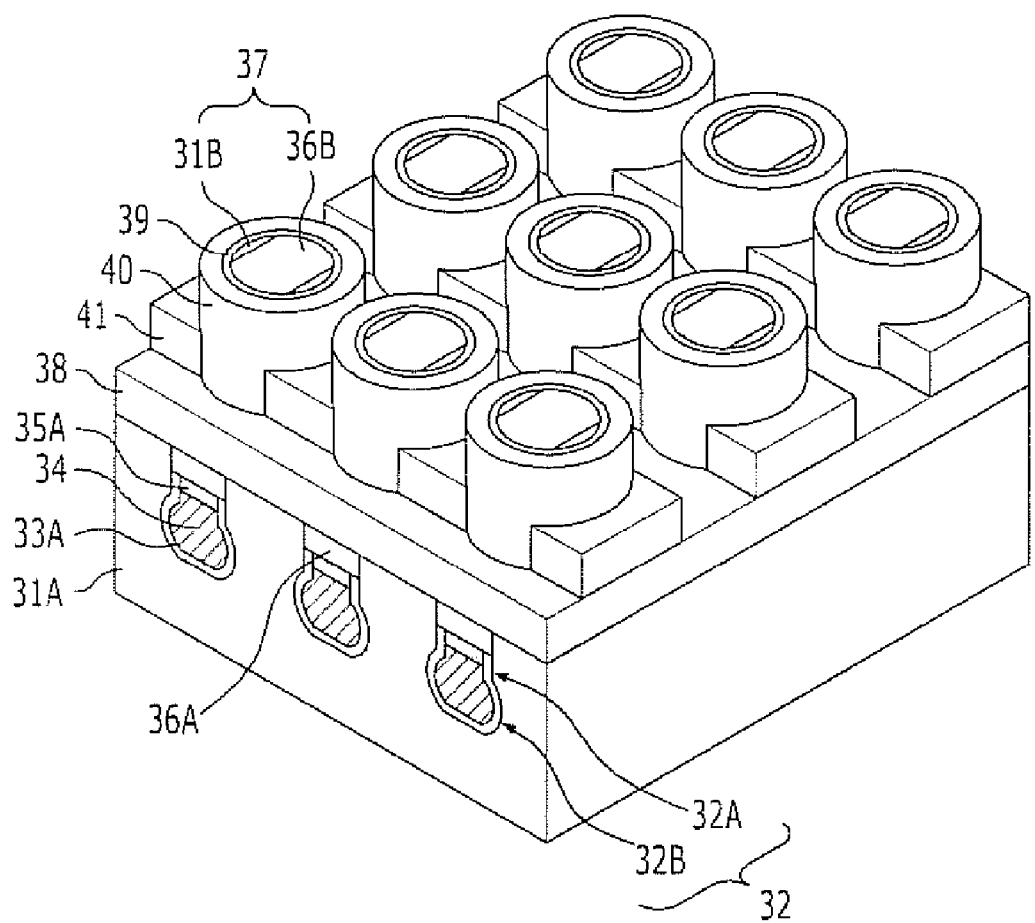
FIG. 6B is a perspective view of the semiconductor device shown in FIG. 5.

FIG. 5 is a plan view illustrating a semiconductor device in accordance with a second embodiment of the present invention. FIG. 6A is a cross-sectional view of the semiconductor device of FIG. 5 along a line A-A' and a line B-B'. FIG. 6B is a perspective view of the semiconductor device shown in FIG. 5.

Referring to FIGS. 5, 6A and 6B, a semiconductor substrate 31A according to the second embodiment includes a plurality of trenches 32, and a plurality of buried bit lines 34 are formed to fill a portion of each trench 32, individually. The buried bit lines 34 may be a metal layer to reduce the resistance more than the resistance of the buried bit lines 34 formed through an ion implantation process. A barrier layer pattern 33A may be disposed on the interface between the buried bit lines 34 and the semiconductor substrate 31A to prevent diffusion. The barrier layer pattern 33A may be a stacked layer where a titanium (Ti) layer and a titanium nitride (TiN) layer are stacked.

The trenches 32 may have a form of bulb. More specifically, the trenches 32 include a first trench 32A and a second trench 32B which is connected to the bottom of the first trench 32A and has a greater line width than that of the first trench 32A. The buried bit lines 34 have a structure of filling the second trench 32B. Here, since the buried bit lines 34 have a structure of filling the second trench 32B which has a relatively greater line width, the total volume of the buried bit lines 34 may increase. Therefore, the resistance of the buried bit lines 34 may be decrease.

A plurality of active pillars 37 are formed over the buried bit lines 34. Each active pillar 37 includes a first active pillar 36B gap-filling the upper portion of each buried bit line 34 and a second active pillar 31B formed on both sidewalls of the first active pillar 36B. Here, the first active pillar 36B and the second active pillar 31B may be formed of the same material. The second active pillar 31B is a structural element formed by etching the semiconductor substrate 31A, e.g., a silicon substrate, and the first active pillar 36B is a silicon epitaxial layer. These elements will be described in detail later. An inter-layer dielectric layer 38 is formed over the semiconductor substrate 31A in the outside of the active pillar 37. A conductive layer pattern 36A is disposed between the buried bit line 34 and the first active pillar 36B, and the conductive layer pattern 36A is of the same material as that of the first active pillar 363. In other words, a portion of the first active pillar 36B, which is the conductive layer pattern 36A, fills the remaining portion of each trench 32. The conductive layer pattern 36A electrically connects the active pillar 37 to the buried bit line 34.

Also, an ohmic contact layer 35A is interposed between the active pillars 37 and the buried bit lines 34. More specifically, the ohmic contact layer 35A is positioned between the first active pillar 36B and the buried bit line 34. To be more specific, the ohmic contact layer 35A is positioned between the conductive layer pattern 36A and the buried bit line 34. The ohmic contact layer 35A alleviates the potential barrier (or a work function difference) between the active pillars 37 including a semiconductor material such as a silicon layer, and the buried bit lines 34 including the metal layer as well as reducing contact resistance. Since a metal silicide used for the ohmic contact layer, for example, is a low-resistance substance, the contact resistance may be easily reduced. Also, since the metal silicide is a material formed by combining silicon and metal, the metal silicide may stably alleviate the potential barrier between the buried bit lines 34 including a metal layer and the active pillars 37 including a silicon layer. For example, at the junction between the metal layer and the silicon layer, a Schottky barrier may be formed due to the work function difference between them. In other words, a Schottky barrier may be formed between the buried bit lines 34 and the active pillars 37, and the contact resistance may be increased between them due to the Schottky barrier. Use of the metal silicide as the ohmic contact layer 35A prevents/reduces formation of Schottky barriers between the buried bit lines 34 and the active pillars 37.

The active pillars 37 are disposed over the buried bit lines 34, respectively. In other words, each of the active pillars 37, which are disposed apart from each other by a desired space, is formed in the upper portion of each buried bit line 34. As a result, the active pillars 37 are arranged in a matrix form.

The external walls of each active pillar 37 are surrounded by eath vertical gate 40, and a gate insulation layer 39 is formed between the vertical gate 40 and the active pillar 37.

Neighboring vertical gates 40 are connected to each other by word lines 41. The word lines 41 are insulated from the buried bit lines 34 by the inter-layer dielectric layer 38. The word lines 41 and the buried bit lines 34 are arranged to cross each other at, for example, right angles. The word lines 41 may be a metal layer. For example, the word lines 41 include any one selected from the group consisting of tungsten silicide ($WSi_x$), titanium nitride (TiN), tungsten (W), aluminum (Al), copper (Cu), gold (Au), and ruthenium (Ru).

FIGS. 7A to 7I are cross-sectional views describing a method for fabricating the semiconductor device of FIG. 5 along the line A-A' and the line B-B' in accordance with the second embodiment of the present invention. FIGS. 8A to 8I are perspective views describing the method for fabricating the semiconductor device in accordance with the second embodiment of the present invention.

Figure 7C:
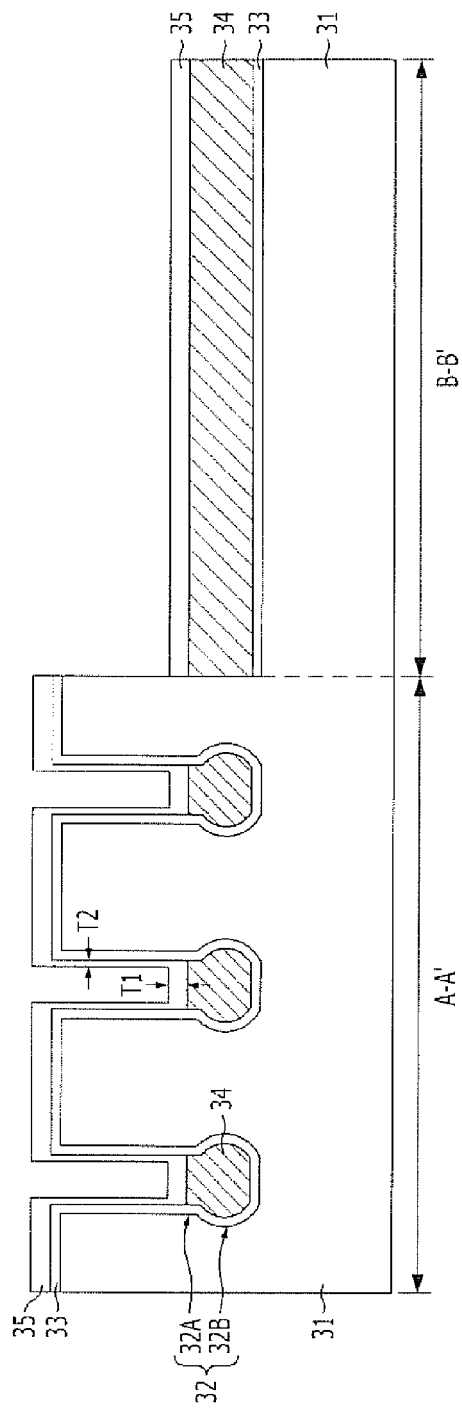
Figure 8A:
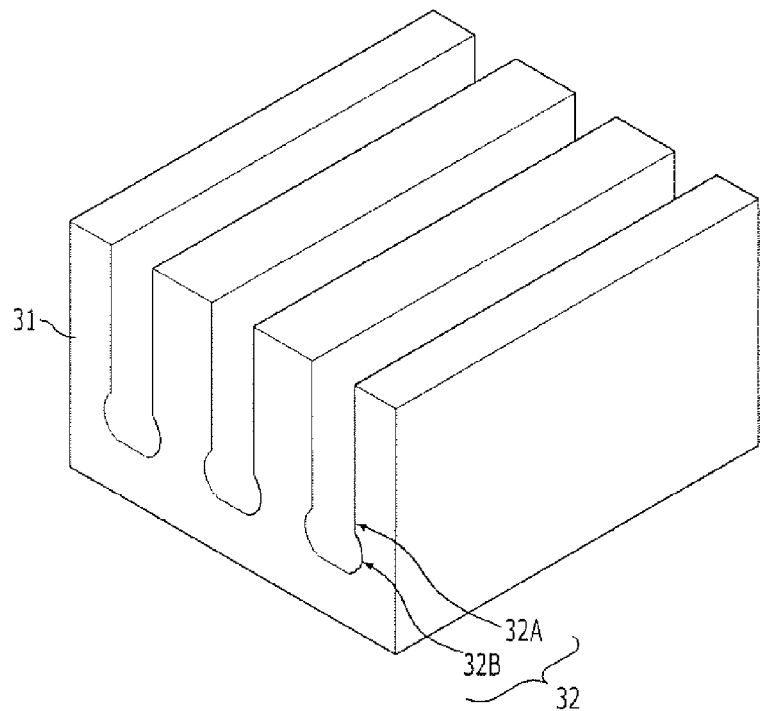
FIGS. 8A to 8I are perspective views describing the method for fabricating the semiconductor device in accordance with the second embodiment of the present invention.

Referring to FIGS. 7A and 8A, the trenches 32 are formed by etching a semiconductor substrate 31 to a desired depth. The semiconductor substrate 31 may include a silicon substrate. To form the trenches 32, the semiconductor substrate 31 may be etched using a hard mask layer (not shown). The trenches 32 are formed as a bulb type, where they extend as lines in one direction.

The etching method for etching the semiconductor substrate 31 to form the trenches 32 may include a primary etch process for forming the first trench 32A through an anisotropic dry etch process and a secondary etch process for forming a round second trench 32B having a greater line width than that of the first trench 32A by etching the semiconductor substrate 31 under the first trench 32A through an isotropic etch process. When the semiconductor substrate 31 is a silicon substrate, the primary and secondary etch processes may be performed using chlorine ($Cl_2$) gas or hydrogen bromide (HBr) gas alone or a mixed gas of chlorine ($Cl_2$) gas and hydrogen bromide (HBr) gas. The depth of the trenches 32 depends on the height of the buried bit lines 34, which will be formed subsequently. For example, the trenches 32 may be formed with a depth of approximately 5,000 Å.

Figure 8B:
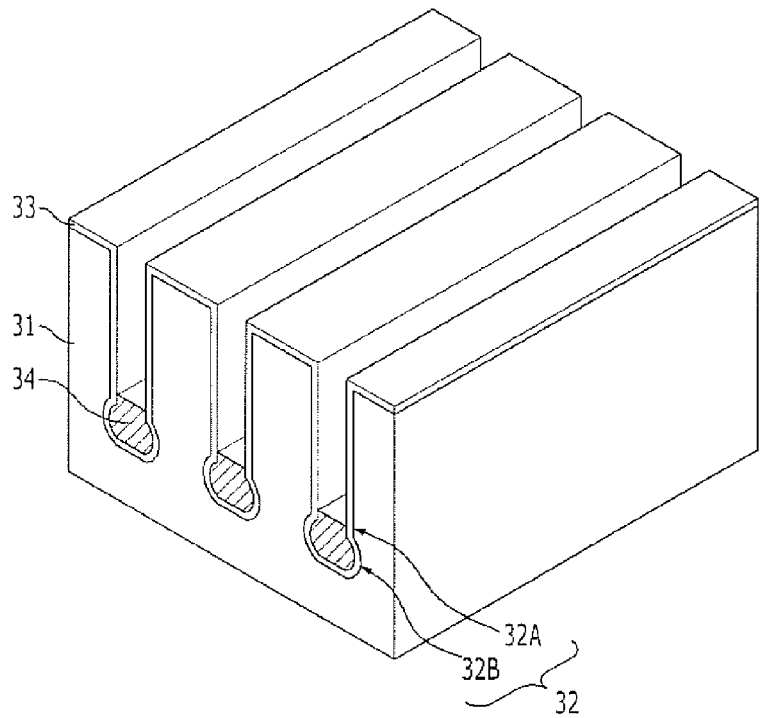

Referring to FIGS. 7B and 8B, a barrier layer 33 is formed on the surface of the semiconductor substrate 31 including the trenches 32. The barrier layer 33 may be formed of a nitride layer or by stacking a titanium (Ti) layer and a titanium nitride (TiN) layer. According to another embodiment, a spacer insulation layer instead of forming the barrier layer 33 may be formed using a nitride layer.

Subsequently, a metal layer is formed over the barrier layer 33 until the trenches 32 are gap-filled, and the buried bit lines 34 each filling a portion of each trench 32 are formed by performing an etch-back process. The buried bit lines 34 may be formed to fill at least the second trench 32B. Here, the metal layer used as the buried bit lines 34 may include a tungsten layer.

Figure 8C:
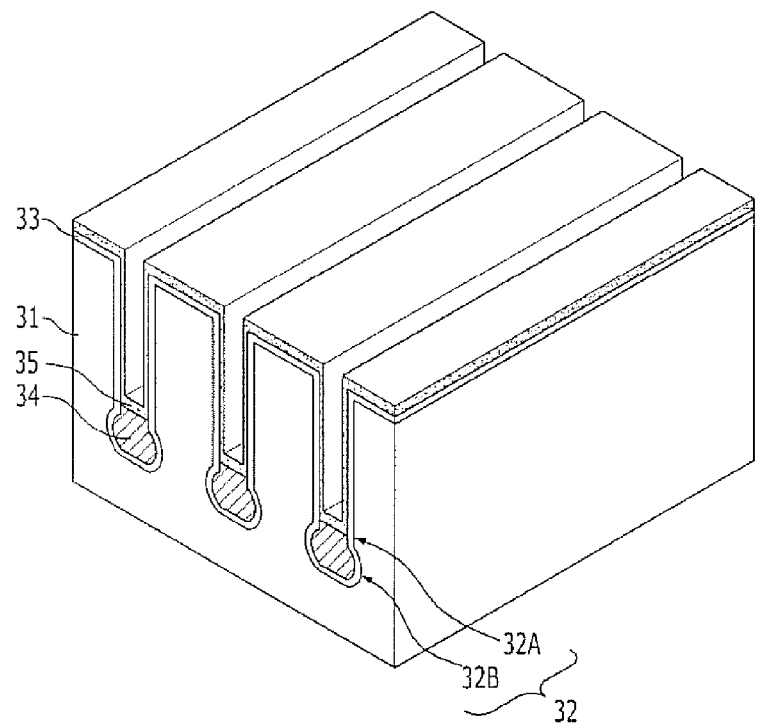

Referring to FIGS. 7C and 8C, the metal silicide layer 35 is formed over the substrate structure including the buried bit lines 34. Here, the thickness T1 of the metal silicide formed over the buried bit lines 34 may be thicker than the thickness T2 of the metal silicide layer 35 formed on the sidewalls of each trench 32 (T1>T2). Here, the metal silicide layer 35 may include a tungsten silicide (WSi) layer.

The metal silicide layer 35 having different thickness for different locations as described above may be formed through a Physical Vapor Deposition (PVD) method which can control the deposition rate in the horizontal and vertical directions. The metal silicide layer 35 may be formed by sputtering a metal silicide target, or the metal silicide layer 35 may be formed by alternately sputtering a metal target and a silicon target multiple times. Here, the deposition speed (or deposition thickness) in the vertical direction may be controlled to be faster (or thicker) than the deposition speed (or deposition thickness) in the horizontal direction by controlling the voltage bias applied to a bottom electrode which accelerates sputtered elements to the semiconductor substrate 31.

Figure 7D:
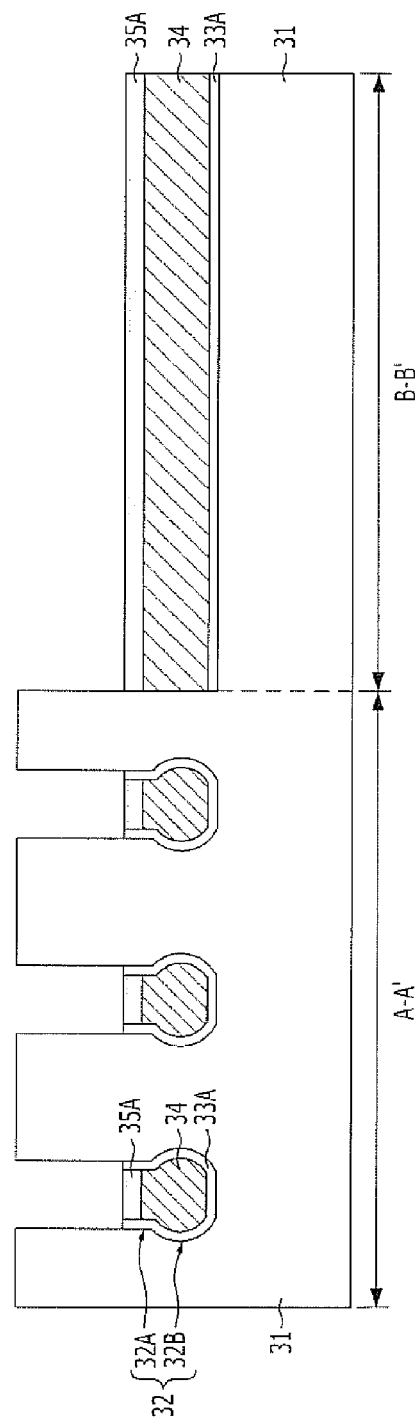
Figure 8D:
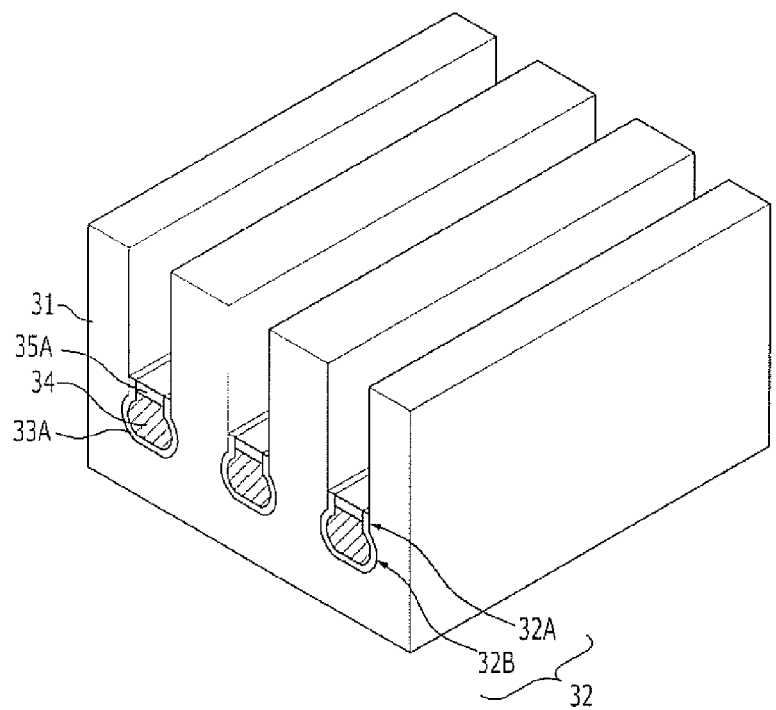

Referring to FIGS. 7D and 8D, the metal silicide layer 35 remains only in the upper portion of the buried bit lines 34 by performing a selective etching process onto the metal silicide layer 35. In other words, the ohmic contact layer 35A is formed by leaving the metal silicide layer 35 over the buried bit lines 34. The etching method performed onto the metal silicide layer 35 to form the ohmic contact layer 35A may be a wet etch process or a dry etch process.

Subsequently, the sidewalls of each trench 32 (that is, the barrier layer 33 and the ohmic contact layer 34 over the semiconductor substrate 31) are selectively removed, except the buried bit lines 34 and the ohmic contact layer 35A. Hereafter, the etched barrier layer 33 is referred to as a barrier layer pattern 33A.

The barrier layer 33 is etched through the etch-back process. Accordingly, the barrier layer pattern 33A remains only on the interface between the buried bit lines 34, the ohmic contact layer 35A, and the semiconductor substrate 31 in the inside of the trenches 32. Hereafter, the sidewalls of the trench 32 after the barrier layer 33 is removed are referred to as top sidewalls for the illustration purposes.

Figure 8E:
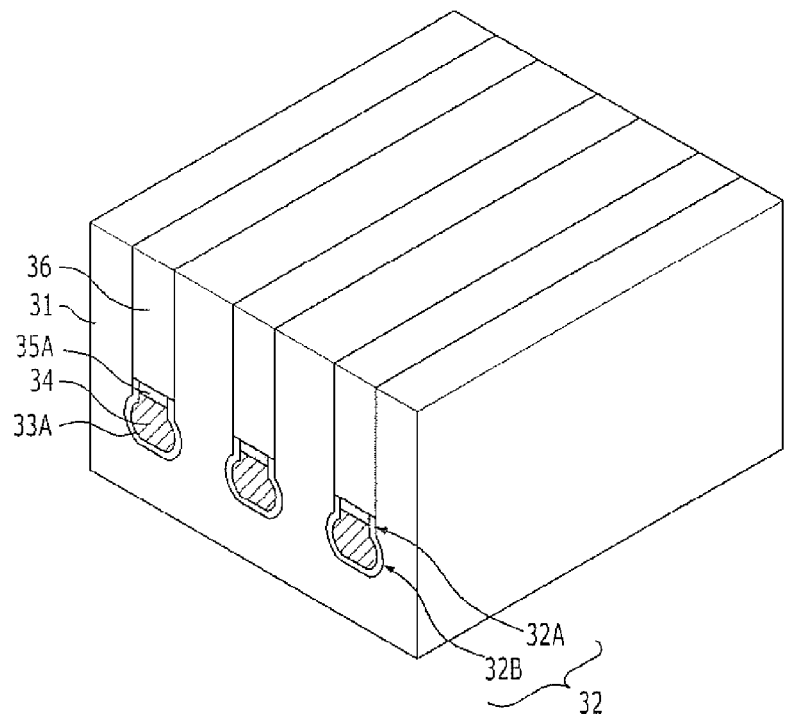

Referring to FIGS. 7E and 8E, a conductive layer 36 gap-filling the other portion of the trench 32 is formed in the upper portion of each buried bit Fine 34. The conductive layer 36 gap-fills the upper-portion of each buried bit line 34 through epitaxial growth. Here, the epitaxial growth is performed on the top sidewalls. Since the semiconductor substrate 31 is a silicon substrate, it is called silicon epitaxial growth.

Through the epitaxial growth, the conductive layer 36 gap-filling the upper portion of the buried bit line 34 is grown, and the conductive layer 36 includes a silicon epitaxial layer.

Meanwhile, the conductive layer 36 may also grow on the upper surface of the semiconductor substrate 31, and a surface step height may occur due to the conductive layer 36 formed on the upper surface of the semiconductor substrate 31. Therefore, a planarization process may be performed to remove the surface step height on the upper surface of the semiconductor substrate 31. Here, the planarization process may be a Chemical Mechanical Polishing (CMP) process.

Figure 8F:
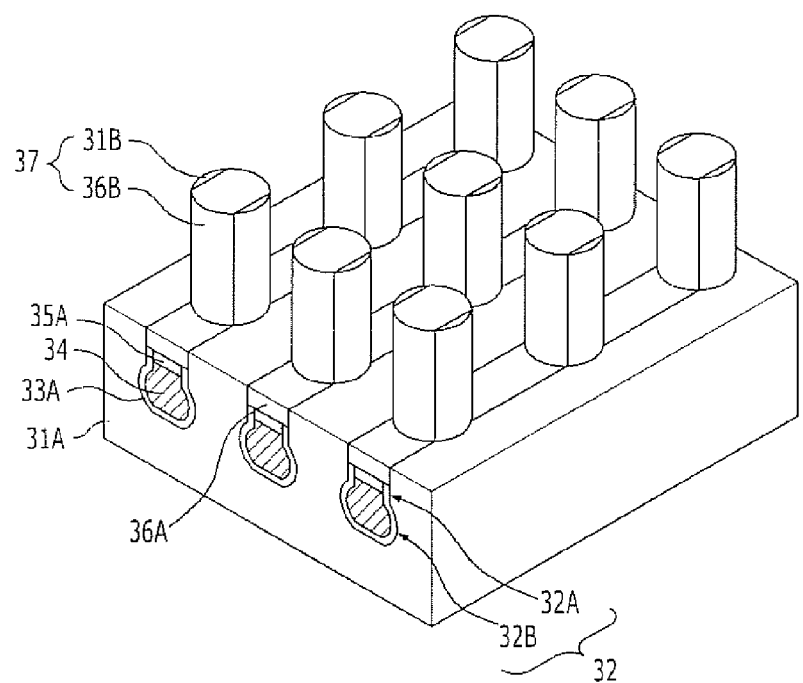

Referring to FIGS. 7F and 8F, the active pillars 37 separated from each other are formed by simultaneously etching the semiconductor substrate 31 and the conductive layer 36. Here, the active pillars 37 may have a cylindrical pillar structure. The active pillars 37 may be referred to as active regions as well. Hereafter, the semiconductor substrate 31 with the active pillars 37 is denoted with 31A.

The active pillars 37 have a structure of cylindrical pillars, each of which includes the first active pillar 36B and the second active pillar 31B. The first active pillar 36B is formed by etching the conductive layer 36, and the second active pillar 31B is formed by etching the semiconductor substrate 31. Here, the first active pillar 36B is a silicon epitaxial layer, and the second active pillar 31B is a silicon layer. Thus, the active pillars 37 may be called silicon structures. Looking at the active pillars 37 from the top, the active pillars 37 are arranged in the form of matrix.

The active pillars 37 are formed by etching the semiconductor substrate 31 and the conductive layer 36 by using a photoresist pattern (not shown), and the etch depth is controlled in such a manner that the bottom surface of the active pillars 37 is at least higher than the upper surface of the buried bit lines 34. According to an embodiment, in the etch process for forming the active pillars 37, the etch depth is decided in such a manner that the bottom surface of the etched portion is higher than the surface of the ohmic contact layer 35A. Accordingly, the conductive layer pattern 36A may remain with a desired thickness in the upper portion of the buried bit lines 34, and the height of the semiconductor substrate 31A may be lowered by lowering the second active pillar 31B. The conductive layer pattern 36A has a pattern of integrated lines connected to the first active pillars 36B in the upper portion of the conductive layer pattern 36A. The active pillars 37 functioning as active regions by the conductive layer pattern 36A are electrically connected to the buried bit lines 34.

Figure 8G:
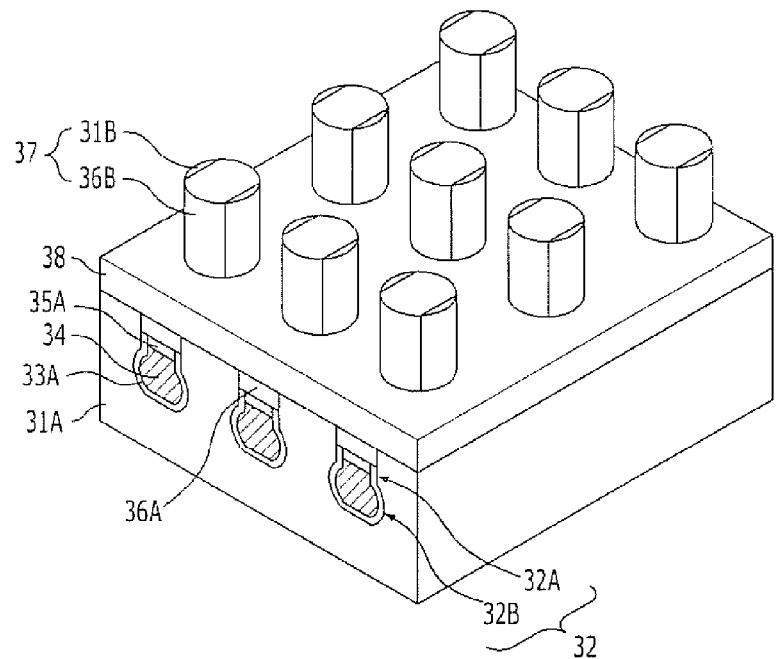

Referring to FIGS. 7G and 8G, the inter-layer dielectric layer 38 gap-filling the space between the active pillars 37 is formed, and then a recess process is performed by sequentially performing an etch-back process and a wet etch process. The inter-layer dielectric layer 38 may be formed of boro-phosphorous silicate glass (BPSG), which has excellent gap-filling characteristics. The inter-layer dielectric layer 38 covers the surfaces of the semiconductor substrate 31A around the active pillars 37 and the conductive layer pattern 36A.

Figure 8H:
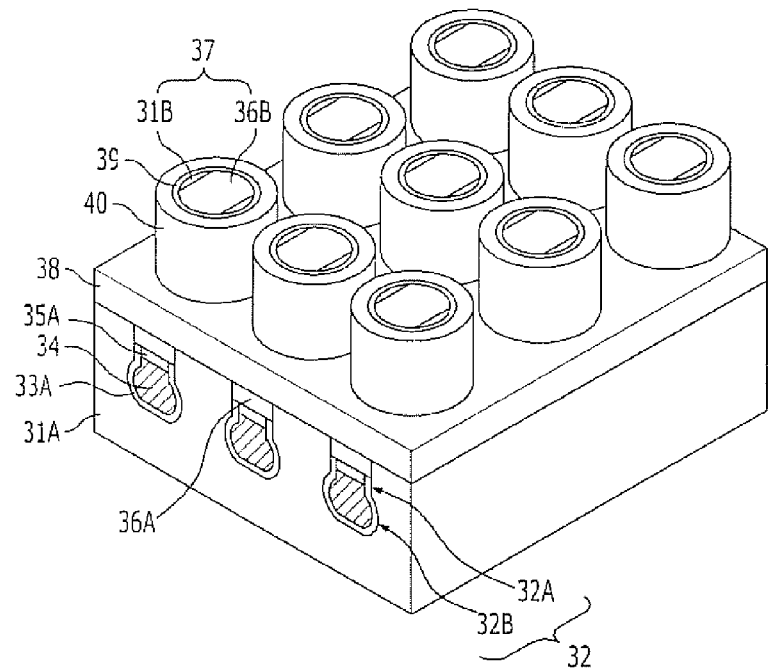

Referring to FIGS. 7H and 8H, a gate insulation layer 39 is formed on the sidewalls of the active pillars 37. The gate insulation layer 39 may include a silicon oxide layer, and the gate insulation layer 39 may be formed with a thickness of approximately 50 Å through a deposition process or an oxidation process.

Subsequently, vertical gates 40 are formed by depositing the conductive layer to be used as gates and performing an etch-back process. The conductive layer used as the vertical gates 40 may be a metal layer or a silicon layer. The vertical gates 40 are of a surround gate type, where each vertical gate 40 surrounds the respective active pillar 37.

Figure 7I:
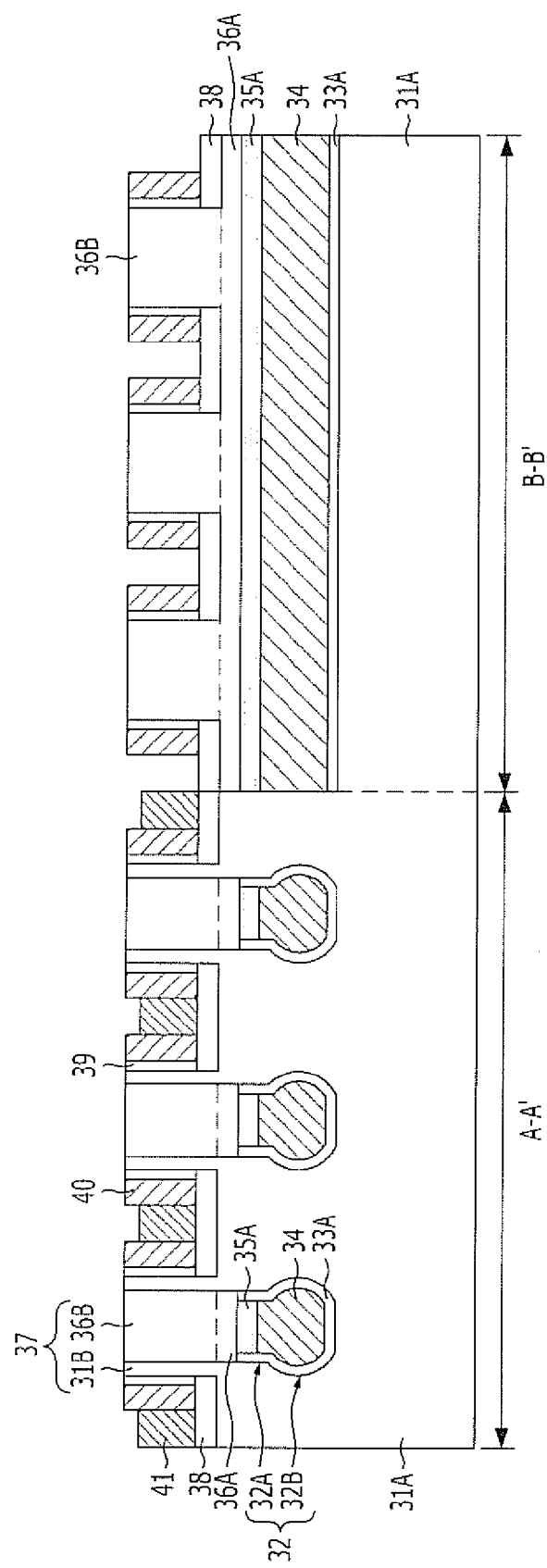
Figure 8I:
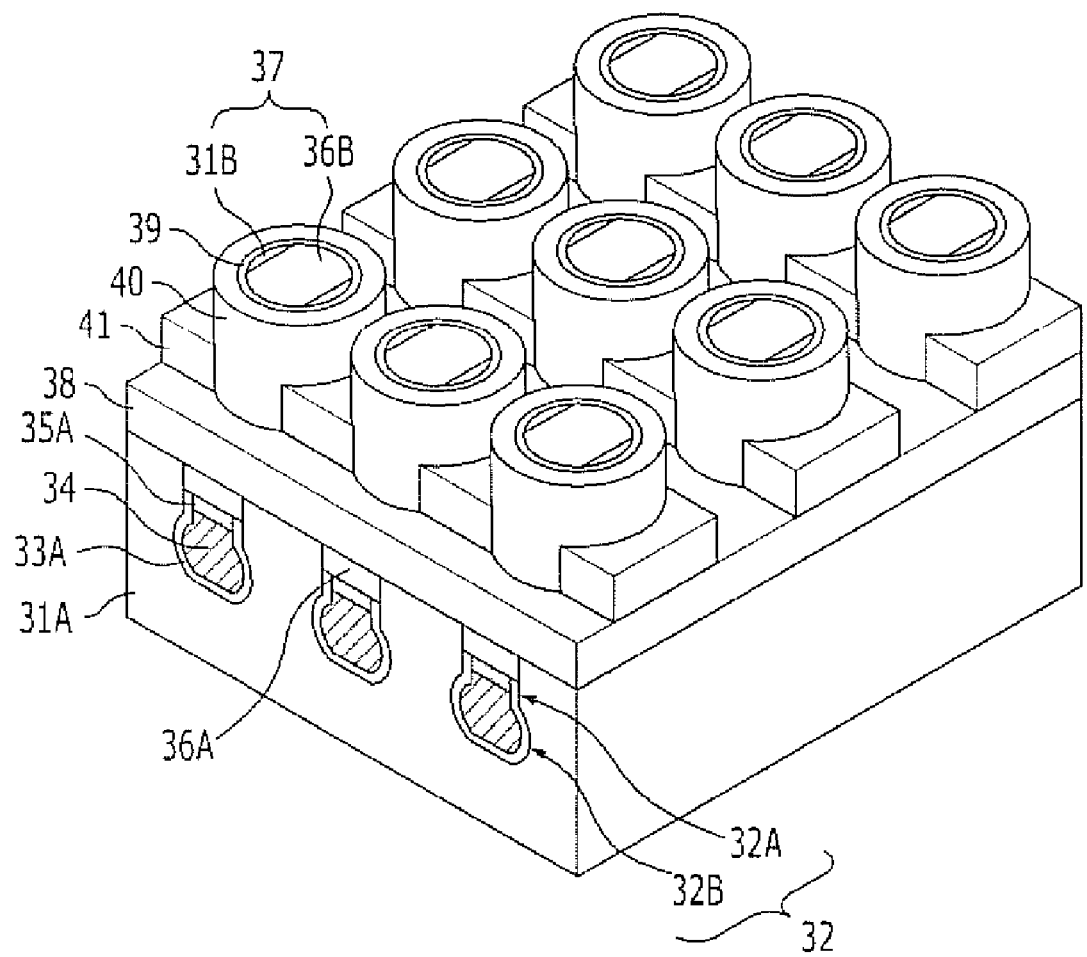

Referring to FIGS. 7I and 8I, the word lines 41 are formed to connect the neighboring vertical gates 40 to each other. The word lines 41 may be a metal layer. For example, the word lines 41 may include any one selected from the group consisting of tungsten silicide ($WSi_x$), titanium nitride (TiN), tungsten (W), aluminum (Al), copper (Cu), gold (Au), and ruthenium (Ru). The word lines 41 are arranged to cross the buried bit lines 34 at, for example, right angles, and the word lines 41 are insulated from the buried bit lines 34 by the inter-layer dielectric layer 38.

The word lines 41 may be formed as follows.

First, a metal layer to be used as the word lines 41 is formed over the substrate structure including the vertical gates 40, and a partial etch-back process is performed onto the metal layer. Subsequently, the word lines 41 are formed by partially etching the metal layer in a direction crossing the buried bit lines 34.

According to the second embodiment of the present invention, any increase in the resistance of the buried bit lines 34 in that may have occurred in separating the buried bit lines 34 from one cell to another cell after the formation of the buried bit lines may be prevented by forming the buried bit lines 34 that fill the trenches 32, respectively, under the active pillars 37. Since the process of separating the buried bit lines 34 from one cell to another cell is not required, the process may be simplified and the process complexity may be decreased.

Also, since the buried bit lines 34 fill the second trench 32B having a relatively longer line width for the trenches 32 by having a bulb shape, the resistance of the buried bit lines 34 may be further reduced.

In addition, since the ohmic contact layer 35A is interposed between the active pillars 37 and the buried bit lines 34, the contact characteristics and contact resistance between the active pillars 37 and the buried bit lines 34 may be improved.

Furthermore, since the active pillars 37, the vertical gates 40, and the word lines 41 are formed after the formation of the buried bit lines 34, the complexity in the process for forming the buried bit lines 34 is decreased.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
   a semiconductor substrate configured to include a plurality of trenches therein;
   a plurality of buried bit lines each configured to fill a portion of each trench;
   a plurality of active pillars each formed in an upper portion of each buried bit line;
   a plurality of vertical gates each configured to surround each active pillar; and a plurality of word lines configured to couple neighboring vertical gates with each other.

2. The semiconductor device of claim 1, further comprising:
an ohmic contact layer interposed between the plurality of the buried bit lines and the plurality of the active pillars.

3. The semiconductor device of claim 2, wherein the ohmic contact layer comprises a metal silicide layer.

4. The semiconductor device of claim 1, wherein each of the plurality of the active pillars comprises:
a first active pillar electrically connected to each buried bit line; and
a second active pillar formed on both sidewalls of each first active pillar.

5. The semiconductor device of claim 4, wherein the first active pillar is a silicon epitaxial layer, and the second active pillar is of the same material as a material of the semiconductor substrate.

6. The semiconductor device of claim 1, wherein each of the plurality of the trenches comprises:
a first trench; and
a second trench configured to be coupled with a lower portion of the first trench and have a longer line width than a line width of the first trench.

7. The semiconductor device of claim 6, wherein the plurality of the buried bit lines fill the plurality of the second trenches.

* * * * *